US008699121B2

(12) United States Patent
Deguenther

(10) Patent No.: US 8,699,121 B2
(45) Date of Patent: Apr. 15, 2014

(54) ILLUMINATION SYSTEM OF A MICROLITHOGRAPHIC PROJECTION EXPOSURE APPARATUS

(71) Applicant: Carl Zeiss SMT GmbH, Oberkochen (DE)

(72) Inventor: Markus Deguenther, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/044,048

(22) Filed: Oct. 2, 2013

(65) Prior Publication Data

US 2014/0043665 A1 Feb. 13, 2014

Related U.S. Application Data

(63) Continuation of application No. PCT/EP2011/002273, filed on May 6, 2011.

(51) Int. Cl.
*G02B 26/08* (2006.01)
*G03B 27/54* (2006.01)

(52) U.S. Cl.
USPC .......................... 359/298; 359/201.2; 355/67

(58) Field of Classification Search
USPC .................. 359/201.1–201.2, 298–299, 305, 359/315–318; 355/67
See application file for complete search history.

(56) References Cited

U.S. PATENT DOCUMENTS

| 7,061,582 | B2 | 6/2006 | Zinn et al. |
| 2006/0087634 | A1 | 4/2006 | Brown et al. |
| 2009/0115990 | A1 | 5/2009 | Owa et al. |
| 2010/0060873 | A1 | 3/2010 | Deguenther et al. |
| 2010/0157268 | A1* | 6/2010 | Fiolka et al. ................. 355/67 |

FOREIGN PATENT DOCUMENTS

| EP | 1 262 836 | 12/2002 |
| EP | 2 146 248 | 1/2010 |
| WO | WO 2005/026843 | 3/2005 |
| WO | WO 2009/080279 | 7/2009 |
| WO | WO 2009/150871 | 12/2009 |
| WO | WO 2010/044307 | 4/2010 |
| WO | WO 2012/034571 | 3/2012 |

OTHER PUBLICATIONS

International Search Report for corresponding PCT Appl. No. PCT/EP2011/002273, dated Sep. 27, 2011.

* cited by examiner

*Primary Examiner* — James Phan
(74) *Attorney, Agent, or Firm* — Fish & Richardson P.C.

(57) ABSTRACT

An illumination system of a microlithographic projection exposure apparatus comprises an optical raster plate having a light entrance surface. An irradiance distribution on the light entrance surface determines an angular light distribution of projection light when it impinges on a mask to be illuminated. The illumination system further comprises a control unit and a spatial light modulator which produces on the light entrance surface of the optical raster plate a plurality of light spots whose positions can be varied. At least some of the light spots have, along a reference direction (X), a spatial irradiance distribution comprising a portion in which the irradiance varies periodically with a spatial period P.

20 Claims, 13 Drawing Sheets

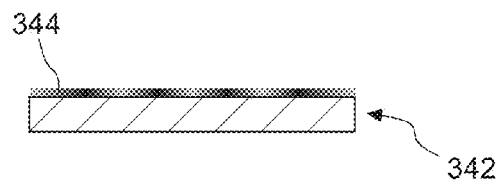
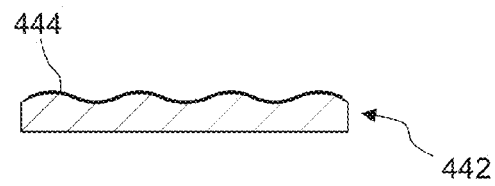
Fig. 28          Fig. 29
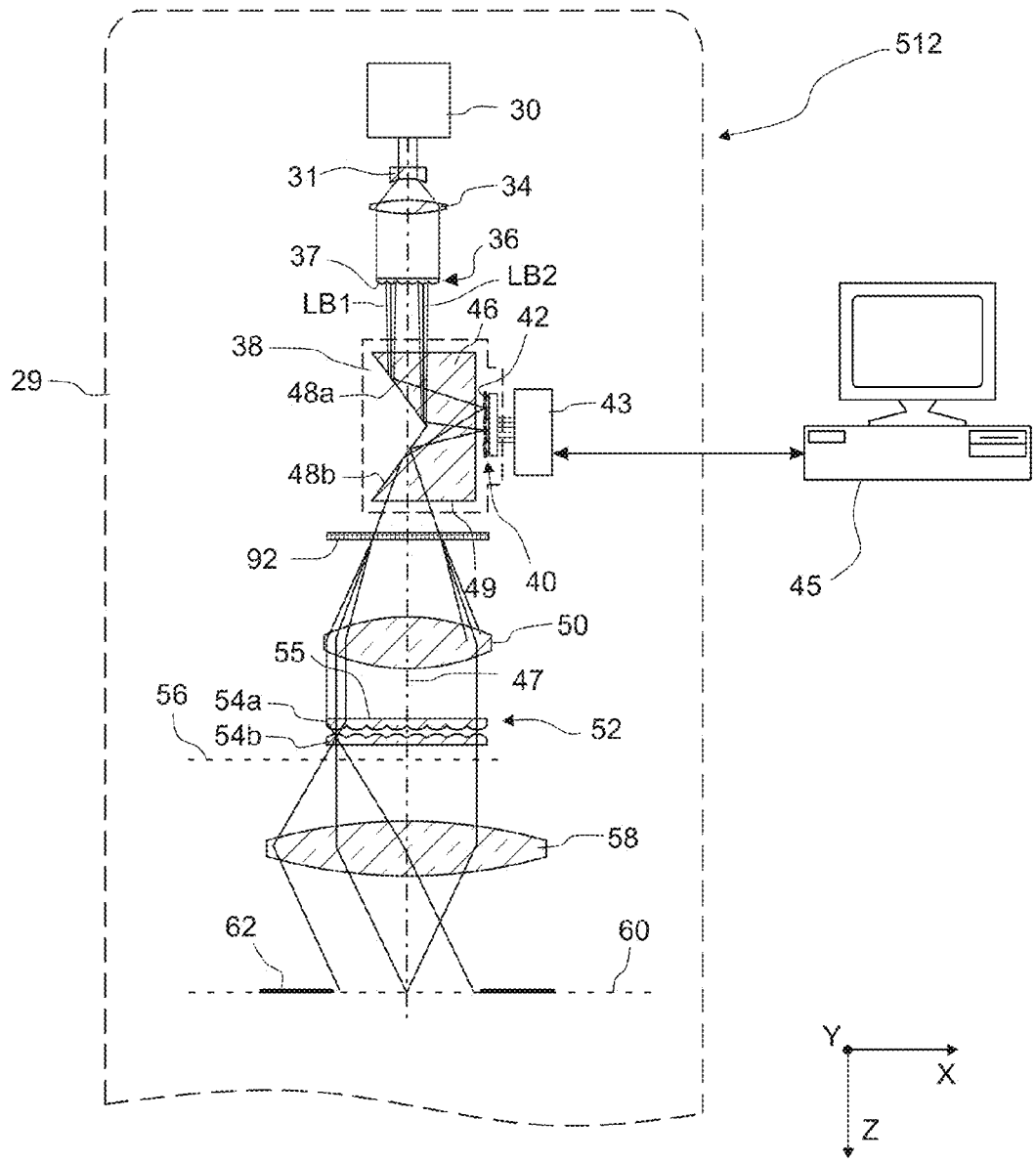
Fig. 30

ILLUMINATION SYSTEM OF A MICROLITHOGRAPHIC PROJECTION EXPOSURE APPARATUS

CROSS-REFERENCE TO RELATED APPLICATIONS

The present application is a continuation of, and claims benefit under 35 USC 120 to, international application PCT/EP2011/002273, filed May 6, 2011, the entire disclosure of which is incorporated by reference herein.

BACKGROUND OF THE INVENTION

1. Field of the Invention

The invention generally relates to an illumination system of a microlithographic projection exposure apparatus, and in particular to an apparatus comprising an array of micromirrors or other beam deflecting elements that can be individually controlled.

2. Description of Related Art

Microlithography (also referred to as photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to light of a certain wavelength. Next, the wafer with the photoresist on top is exposed to projection light through a mask in a projection exposure apparatus. The mask contains a circuit pattern to be imaged onto the photoresist. After exposure the photoresist is developed to produce an image that corresponds to the circuit pattern contained in the mask. Then an etch process transfers the circuit pattern into the thin film stacks on the wafer. Finally, the photoresist is removed. Repetition of this process with different masks results in a multi-layered microstructured component.

A projection exposure apparatus typically includes an illumination system that illuminates a field on the mask that may have the shape of a rectangular or curved slit, for example. The apparatus further comprises a mask stage for aligning the mask, a projection objective (sometimes also referred to as 'the lens') that images the illuminated field on the mask onto the photoresist, and a wafer alignment stage for aligning the wafer coated with the photoresist.

One of the essential aims in the development of projection exposure apparatus is to be able to lithographically define structures with smaller and smaller dimensions on the wafer. Small structures lead to a high integration density, which generally has a favorable effect on the performance of the microstructured components produced with the aid of such apparatus.

Various approaches have been pursued in the past to achieve this aim. One approach is to improve the illumination of the mask. Ideally, the illumination system of a projection exposure apparatus illuminates each point of the field illuminated on the mask with projection light having a well defined spatial and angular irradiance distribution. The term angular irradiance distribution describes how the total light energy of a light bundle, which converges towards a particular point on the mask, is distributed among the various directions of the rays that constitute the light bundle.

The angular irradiance distribution of the projection light impinging on the mask is usually adapted to the kind of pattern to be imaged onto the photoresist. For example, relatively large sized features may require a different angular irradiance distribution than small sized features. The most commonly used angular irradiance distributions are referred to as conventional, annular, dipole and quadrupole illumination settings. These terms refer to the irradiance distribution in a pupil surface of the illumination system. With an annular illumination setting, for example, only an annular region is illuminated in the pupil surface. Thus there is only a small range of angles present in the angular irradiance distribution of the projection light, and all light rays impinge obliquely with similar angles onto the mask.

Different approaches are known in the art to modify the angular irradiance distribution of the projection light in the mask plane so as to achieve the desired illumination setting. For achieving maximum flexibility in producing different angular irradiance distribution in the mask plane, it has been proposed to use a spatial light modulator comprising a mirror array for producing a desired irradiance distribution in the pupil surface.

In EP 1 262 836 A1 the mirror array is realized as a microelectromechanical system (MEMS) comprising more than 1000 microscopic mirrors. Each of the mirrors can be tilted about two orthogonal tilt axes. Thus projection light incident on such a mirror device can be reflected into almost any desired direction of a hemisphere. A condenser lens arranged between the mirror array and a pupil surface translates the reflection angles produced by the mirrors into locations in the pupil surface. This illumination system makes it possible to illuminate an optical integrator, which is arranged in or immediately in front of the pupil surface, with a plurality of light spots, wherein each light spot is associated with one particular mirror and is freely movable across a light entrance surface of the optical integrator by tilting this mirror.

Similar illumination systems using mirror arrays as spatial light modulators are known from US 2006/0087634 A1, U.S. Pat. No. 7,061,582 B2 and WO 2005/026843 A2.

For such illumination systems it has also been proposed to produce on the light entrance surface of the optical integrator light spots having different sizes or shapes. For example, unpublished international patent application PCT/EP2010/005628 describes an illumination system in which an array of microlenses is arranged in front of the mirror array. Each microlens directs an individual light beam on one of the mirrors of the mirror array. However, the microlenses have different focal lengths, and thus the light spots produced on the light entrance surface of the optical integrator have different sizes.

US 2010/0060873 A1 proposes to image an optical raster plate, which is formed by an array of diffractive optical elements, on the mirrors of a mirror array. Each diffractive optical element is thus imaged on an associated mirror of the mirror array. Since the diffractive optical elements produce different far field irradiance distributions, the light beams reflected from the mirrors of the mirror array have, due to the imaging relationship, angular distributions which produce differently shaped light spots on the light entrance surface of the optical integrator. In some embodiments the light spots have the shape of a hexagon or of a triangle with different orientations.

Also the illumination system disclosed in EP 2 146 248 A1 produces light spots on a light entrance surface of an optical raster plate, which forms part of the optical integrator and comprises a plurality of small optical raster elements. Here the total area of each light spot is much smaller than the area of the light entrance facets of the optical raster elements. By suitably assembling the light spots in various ways, it is thus possible to produce different irradiance patterns on the individual light entrance facets. Since these irradiance patterns are individually imaged on a subsequent field plane, the irradiance distribution in this field plane can be simply modified by changing the irradiance patterns on the light entrance facets. However, this approach requires a mirror array comprising a very large number of mirrors. This significantly increases the complexity and costs of the mirror array and in particular of the control systems required to control the mirrors.

SUMMARY OF THE INVENTION

It is an object of the present invention to provide an illumination system of a microlithographic projection exposure apparatus comprising a spatial light modulator which makes it possible to vary not only the angular irradiance distribution, but also the spatial irradiance distribution in a mask plane very flexibly.

In accordance with the present invention this object is achieved by an illumination system of a microlithographic projection exposure apparatus comprising an optical raster plate which has a light entrance surface. The optical raster plate does not necessarily have to be plane, but may also be curved. An irradiance distribution on the light entrance surface determines an angular light distribution of projection light when it impinges on a mask to be illuminated. The illumination system further comprises a control unit and a spatial light modulator which is configured to produce on the light entrance surface of the optical raster plate a plurality of light spots. The spatial light modulator is configured to vary the position of the light spots on the light entrance surface in response to a command signal received from the control unit. In accordance with the invention at least some of the light spots have, along a reference direction, a spatial irradiance distribution comprising a portion in which the irradiance varies periodically with a spatial period P.

If the control system is configured to control the spatial light modulator such that two of the at least some light spots at least partly overlap on the light entrance side of the optical raster plate, various combined irradiance distributions can be produced. For example, if two light spots are superimposed each having a $\sin^2(x)$ irradiance distribution, a combined irradiance distribution is obtained having a portion which is either uniform or periodic, depending on the distance by which the two light spots are separated.

In particular, the control system may be configured to control the spatial light modulator such that the two overlapping spots are displaced relative to each other along the reference direction by $n_1 \cdot P/2$, with $n_1 = \pm 1, \pm 3, \pm 5, \ldots$. Then maxima of one periodic irradiance distribution will coincide with minima of the other periodic irradiance distribution which results in smaller or even vanishing spatial variations of the combined irradiance.

If the control system is configured to control the spatial light modulator such that the two overlapping spots are displaced relative to each other along the reference direction by $n_2 \cdot P$, with $n_2 = 0, \pm 1, \pm 2, \pm 3, \ldots$, maxima of one periodic irradiance distribution will coincide with maxima of the other periodic irradiance distribution. This results in stronger spatial variations of the combined irradiance.

If the light spots have portions with slightly different spatial periods $P_1$ and $P_2$, the superposition may result in a Moiré interference pattern with a spatial period which is much smaller than $P_1$ or $P_2$.

The illumination system may comprise a condenser that is arranged between the spatial light modulator and the optical raster plate. Such a condenser establishes a Fourier relationship between the spatial light modulator and the optical raster plate so that the angular light distribution produced by the spatial light modulator is transformed in a spatial irradiance distribution on the light entrance surface of the optical raster plate. However, such a condenser may also be dispensed with if the distance between the spatial light modulator and the optical raster plate is sufficiently large (far field approximation).

The optical raster plate may comprise a plurality of optical raster elements, for example lenses or diffractive optical elements, which are arranged along the reference direction with a pitch p. Usually the optical raster elements are arranged in a regular array with a fixed spatial period at least along the reference direction. However, the pitch p does not necessarily have to be constant over the entire light entrance surface of the optical raster element, but may also vary continuously or stepwise. Then the pitch p may be defined as local pitch. In the case of refractive optical raster plates the optical raster elements may be formed by crossed cylindrical lenses or by rotationally symmetrical lenses having a non-circular circumference. If the circumference is rectangular, such lenses are sometimes referred to as lens cushions.

The illumination system may further comprise an imaging optical system that superimposes images of the light spots, which are produced on the optical raster elements, on a field plane, for example a field stop plane in which an adjustable field stop is arranged and which is imaged by an objective on the mask plane.

Such an imaging optical system may comprise a further optical raster plate and a further condenser that is arranged between the further optical raster plate and the field plane.

Light spots having a portion with a spatial period irradiance distribution are also advantageous if the light spots are not superimposed so that they at least partly overlap. Remarkable advantages are also (or additionally) obtained if the spatial period P is carefully adapted to the pitch p of the optical raster elements. For example, the pitch p may be an integral multiple of the spatial period P so that $p = m \cdot P$, with m being a positive integer.

This condition ensures that, in the case of relatively large sized light spots (in particular light spots having a maximum width w along the reference direction with $w > p$, more in particular $p < w < 10p$), the same irradiance distribution is obtained on all optical raster elements that are illuminated by a single light spot at a given time. This facilitates the generation of different (non-uniform) irradiance distributions in the mask plane or any field plane which is optically conjugate to the mask plane. For example, along a scan direction of the projection exposure apparatus it is often desired to have a sloped, for example an approximately Gaussian or sinusoidal, irradiance distribution in the mask plane. Such a sloped irradiance distribution can be produced without any light losses with the help of light spots that have along the same direction a similar (but periodic) irradiance distribution.

In principle, however, the maximum width w of the light spots may also be equal to or smaller than the optical raster elements along the reference direction.

In some embodiments the spatial light modulator comprises an array of beam deflecting elements. Each beam deflecting element is individually capable of deflecting impinging light in a direction which depends on the command signal received from the control unit. Each light spot produced on the light entrance surface of the optical raster element is associated with exactly one beam deflecting element.

In certain embodiments the beam deflecting elements are tiltable mirrors. However, the beam deflecting elements may also be formed by electro- or acousto-optical elements. In such elements the refractive index may be varied by exposing a suitable material to electric fields or ultrasonic waves, respectively. These effects can be exploited to produce index gratings that direct impinging light into various directions.

Only if the control system is configured to control the spatial light modulator such that two light spots at least partly overlap on the light entrance side of the optical raster plate, it is possible to obtain combined irradiance distributions that can be varied by carefully setting the relative displacement of the light spots.

The periodic irradiance distribution within at least a portion of the light spots can also be used to produce field dependent angular irradiance distributions in a field plane. In this case the control system may be configured to control the spatial light modulator such that a first light spot is produced at a first location on the light entrance surface of the optical raster plate so that maximums of the irradiance distribution of the first light spot occur in first relative positions to the optical raster elements. A second light spot is produced at a second location on the light entrance surface of the optical raster plate so that maximums of the irradiance distribution of the second light spot occur in second relative positions to the optical raster elements, wherein the first and the second locations are different and the first and second relative positions are different. The irradiance distributions of the first and second spot may then be equal.

In other words, two light spots are produced at different locations on the light entrance surface of the optical raster plate with their irradiance distributions being arranged at different relative positions to the optical raster elements. Since different relative positions between the irradiance distributions of the light spots and the optical raster elements result in different irradiance distributions on the optical raster elements, each light spot produces a different irradiance distribution in the mask plane or another field plane. On the other hand, the different locations of the spots causes the projection light associated with the two spots to impinge on the mask plane from different directions. These two effects result in a field dependent angular irradiance distribution in the mask plane.

As a matter of course, a similar effect may also be achieved if the light spots have different periodic irradiance distributions. Then the first and second relative positions may be equal.

The illumination system may be configured to rotate the light spots that are produced on the light entrance surface of the optical raster plate in response to a further command signal received from the control unit. Then an additional parameter is available to vary a spatial irradiance distribution in the mask plane. Since the irradiance distributions on the optical raster elements illuminated by the light spots are imaged in a superimposed manner on the mask plane, also these images will rotate. Taking into account the effect of the scan integrated irradiance, the rotated irradiance distributions can be used to carefully adjust the scan integrated exposure dose.

If the spatial light modulator comprises a plurality of beam deflecting elements which cause the periodically varying irradiance distributions within a portion of the light spots, the beam deflecting elements may be configured to be tilted not only around two tilt angles for positioning the light spots on the light entrance surface of the optical raster element, but may be configured also to be rotated around a rotational axis, wherein the tilt axes and the rotational axis are not parallel, and in particular are orthogonal to each other.

The periodically varying irradiance within a portion of the light spots may be produced by diffractive structures or by periodic refractive or reflective structures that are arranged between a light source of the illumination system and the optical raster plate.

In the case of diffractive structures these may be supported by beam deflection elements of the spatial light modulator or by a plate that is arranged between the light source and the optical raster plate. Such a diffractive plate may be imaged by an objective, similar to the arrangement described in the aforementioned US 2010/0060873 A1, on the beam deflection elements. Alternatively, the diffractive plate may be arranged between the beam deflecting elements and the optical raster plate, similar to the arrangement described in the aforementioned WO 2005/026843. In that case the diffractive plate may be arranged in a front focal plane of a condenser that is arranged between the spatial light modulator and the optical raster plate.

If the periodically varying irradiance distribution within the portion of the light spots is produced by the beam deflecting elements themselves, these may be provided with a corrugated reflective or a corrugated refractive surface.

In other embodiments the periodically varying irradiance is produced by imaging, via the optical modulator, a primary periodically varying irradiance distribution on the light entrance surface of the optical raster plate. Such a primary periodically varying irradiance distribution may be an interference pattern, for example. If the interference pattern is a self image of a diffraction grating, the varying irradiance distribution can be produced without any light losses. In that case the interference pattern, which is imaged on the light entrance surface of the optical raster plate, may be spaced apart from the diffraction grating by a Talbot distance, or an integral multiple thereof, that is associated with the diffraction grating.

Subject of the present invention is also a method of illuminating a mask in a microlithographic projection exposure apparatus. In accordance with the present invention a method is proposed which includes the following steps:

a) producing a plurality of light spots on a light entrance surface of an optical raster plate, wherein an irradiance distribution on the light entrance surface determines an angular light distribution of projection light when it impinges on the mask to be illuminated, wherein at least some of the light spots have, along a reference direction, a spatial irradiance distribution comprising a portion in which the irradiance varies periodically with a spatial period P;

b) varying the position of the light spots using a spatial light modulator.

The optical raster plate may comprise a plurality of optical raster elements that are arranged along the reference direction with the pitch p. The pitch p may be an integral multiple of the spatial period P so that $p=m \cdot P$, with m being a positive integer.

The light spots may have a maximum width w along the reference direction with $w>p$.

The spatial light modulator may be controlled such that a first light spot is produced at a first location on the light entrance surface of the optical raster plate so that maximums of the irradiance distribution of the first light spot occur in first relative positions to the optical raster elements, and that a second light spot is produced at a second location on the light entrance surface of the optical raster plate so that maximums of the irradiance distribution of the second light spot occur in second relative positions to the optical raster elements, wherein the first and the second locations are different and the first and second relative positions are different.

DEFINITIONS

The term "light" denotes any electromagnetic radiation, in particular visible light, UV, DUV and VUV light.

The term "light ray" is used herein to denote light whose path of propagation can be described by a line.

The term "light bundle" is used herein to denote a plurality of light rays that have a common origin.

The term "light beam" is used herein to denote all light that passes through a particular lens or another optical element.

The term "surface" is used herein to denote any planar or curved surface in the threedimensional space. The surface may be part of a body or may be completely separated therefrom, as it is usually the case with a field or a pupil plane.

The term "optically conjugate" is used herein to denote an imaging relationship between two points or two surfaces. Thus a light bundle emerging from a point converges at an optically conjugate point.

The term "field plane" is used herein to denote a plane that is optically conjugate to the mask plane.

The term "pupil plane" is used herein to denote a plane in which marginal rays passing through different points in the mask plane or another field plane intersect. As usual in the art, the term "pupil plane" is also used if it is in fact not a plane in the mathematical sense, but is slightly curved so that, in a strict sense, it should be referred to as pupil surface.

The term "condenser" is used herein to denote an optical element or an optical system that establishes (at least approximately) a Fourier relationship between two planes, for example a field plane and a pupil plane.

The term "uniform" is used herein to denote a property that does not depend on the position.

The term "spatial irradiance distribution" is used herein to denote how the total irradiance varies over a surface on which light impinges. Usually the spatial irradiance distribution can be described by a function $I_s(x, y)$, with x, y being spatial coordinates of a point in the surface.

The term "angular irradiance distribution" is used herein to denote how the irradiance of a light bundle varies depending on the angles of the light rays that constitute the light bundle. Usually the angular irradiance distribution can be described by a function $I_a(\alpha, \beta)$, with $\alpha,\beta$ being angular coordinates describing the directions of the light rays. If the angular irradiance distribution has a field dependency, $I_a$ will be also a function of field coordinates x,y, i.e. $I_a=I_a(\alpha, \beta,x,y)$.

The term "optical integrator" is used herein to denote an optical system that increases the product NA·a, wherein NA is the numerical aperture and a is the illuminated field area.

The term "optical raster element" is used herein to denote any optical element, for example a lens, a prism or a diffractive optical element, which is arranged, together with other identical or similar optical raster elements, on a common support so that they commonly form an optical raster plate.

The term "optical power" is used to denote the ability of an optical element to have a diverging or converging effect on light. An optical element having a positive optical power thus has a converging effect, and an optical element having a negative optical power has a diverging optical effect. Optical elements having an optical power may be of the refractive, the reflective or the diffractive type.

The term "converging effect" means that the convergence is increased, irrespective of whether the incoming light is diverging, parallel or already converging. If the incoming light is divergent, the convergence has to be increased to such an extent that the light beams emerging from the optical elements are at least slightly converging.

BRIEF DESCRIPTION OF THE DRAWINGS

Various features and advantages of the present invention may be more readily understood with reference to the following detailed description taken in conjunction with the accompanying drawings in which:

FIG. 28 is a cross-section through a micromirror according to a further embodiment comprising a reflective coating having a spatially varying reflectance;

FIG. 29 is a cross-section through a micromirror according to a still further embodiment having a corrugated reflective surface;

FIG. 30 is a meridional section through a portion of an illumination system according to another embodiment in which a diffractive optical element is used to produce periodically varying irradiance distributions within the light spots;

DESCRIPTION OF PREFERRED EMBODIMENTS

I. General Construction of Projection Exposure Apparatus

Figure 1:
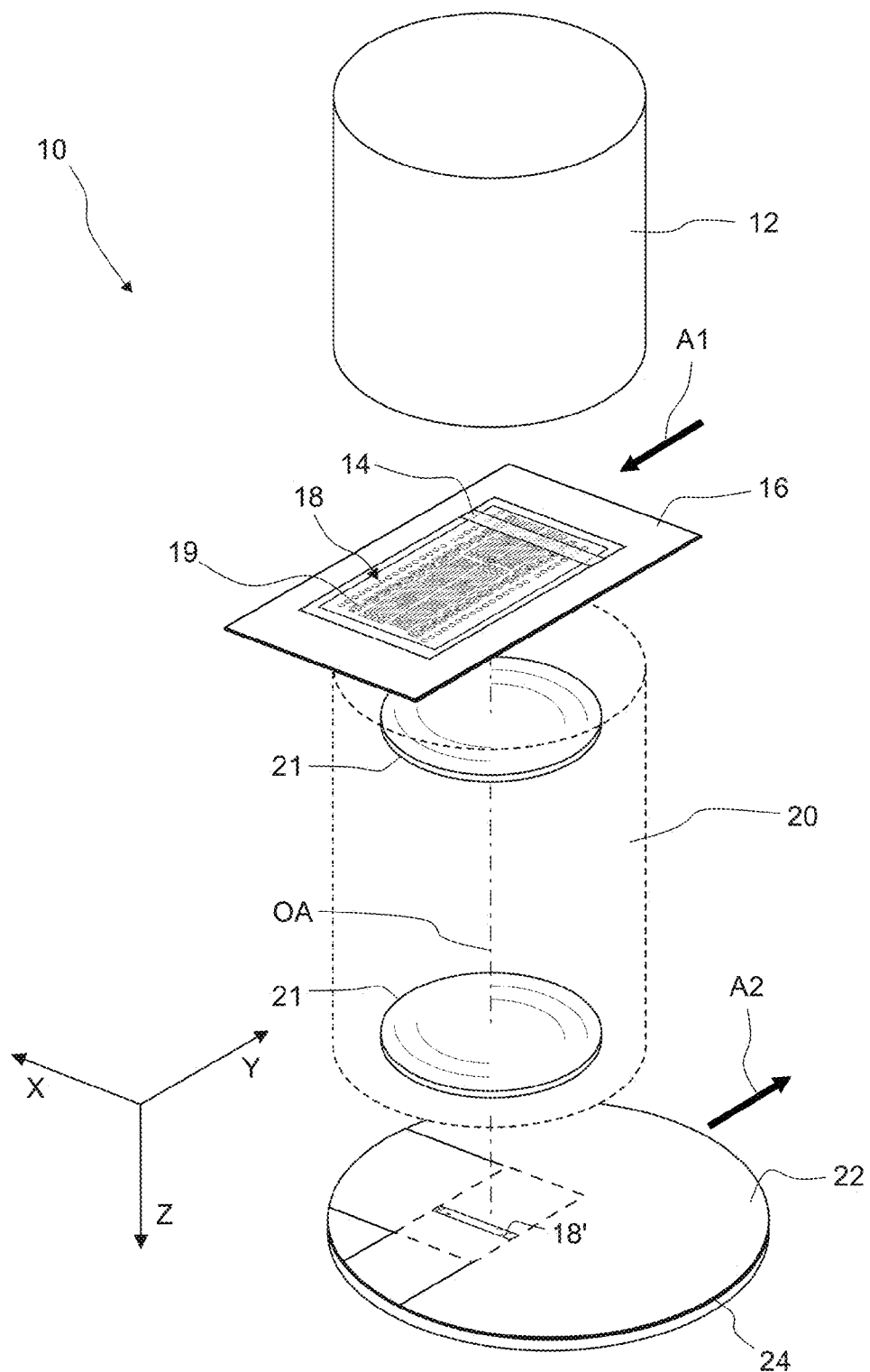
FIG. 1 is a schematic perspective view of a projection exposure apparatus in accordance with one embodiment of the present invention.

FIG. 1 is a perspective and highly simplified view of a projection exposure apparatus 10 in accordance with the present invention. The apparatus 10 comprises an illumination system 12 which produces a projection light beam. The latter illuminates a field 14 on a mask 16 containing a pattern 18 of fine features 19. In this embodiment the illuminated field 14 has a rectangular shape. However, other shapes of the illuminated field 14, for example ring segments, are contemplated as well.

A projection objective 20 having an optical axis OA and containing a plurality of lenses 21 images the pattern 18 within the illuminated field 14 onto a light sensitive layer 22, for example a photoresist, which is supported by a substrate 24. The substrate 24, which may be formed by a silicon wafer, is arranged on a wafer stage (not shown) such that a top surface of the light sensitive layer 22 is precisely located in an image plane of the projection objective 20. The mask 16 is positioned via a mask stage (not shown) in an object plane of the projection objective 20. Since the latter has a magnification β with |β|<1, a minified image 18' of the pattern 18 within the illuminated field 14 is projected onto the light sensitive layer 22.

During the projection the mask 16 and the substrate 24 move along a scan direction which corresponds to the Y direction indicated in FIG. 1. The illuminated field 14 then scans over the mask 16 so that patterned areas larger than the illuminated field 14 can be continuously imaged. The ratio between the velocities of the substrate 24 and the mask 16 is equal to the magnification β of the projection objective 20. If the projection objective 20 inverts the image (β<0), the mask 16 and the substrate 24 move in opposite directions, as this is indicated in FIG. 1 by arrows A1 and A2. However, the present invention may also be used in stepper tools in which the mask 16 and the substrate 24 do not move during the projection of the mask.

II. General Construction of Illumination System

Figure 2:
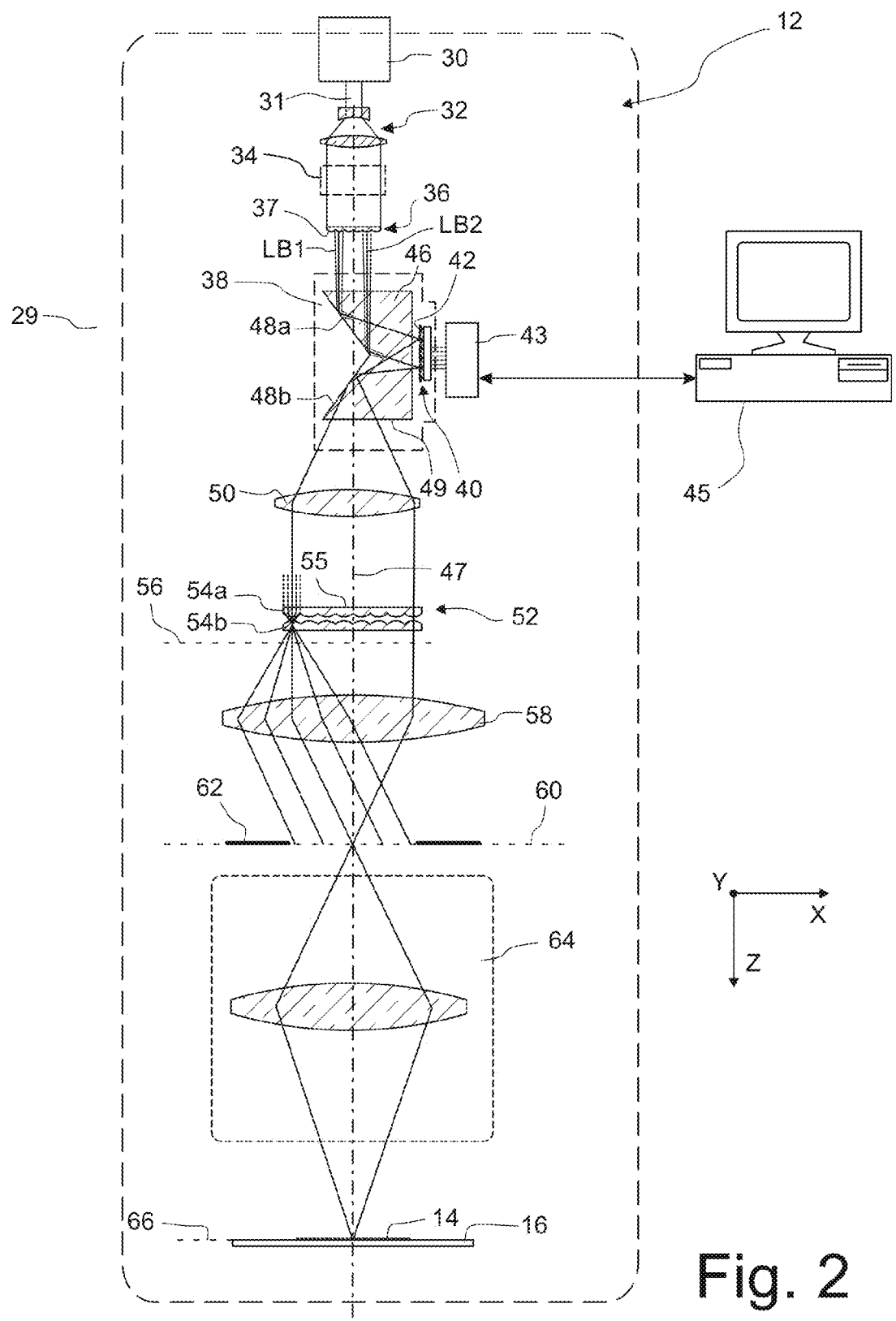
FIG. 2 is a meridional section through an illumination system which contained in the apparatus shown in FIG. 1.

FIG. 2 is a meridional section through the illumination system 12 shown in FIG. 1. For the sake of clarity the illustration of FIG. 2 is considerably simplified and not to scale. This particularly implies that different optical units are represented by one or very few optical elements only. In reality, these units may comprise significantly more lenses and other optical elements.

The illumination system 12 includes a housing 29 and a light source 30 that is, in the embodiment shown, realized as an excimer laser. The light source 30 emits a beam 31 of projection light having a wavelength of about 193 nm. Other types of light sources 30 and other wavelengths, for example 248 nm or 157 nm, are also contemplated.

In the embodiment shown, the light beam 31 emitted by the light source 30 enters a beam expansion unit indicated at 32 in which the light beam is expanded. To this end the beam expansion unit 32 may comprise several lenses, for example a negative and a positive lens as shown in FIG. 2, and/or several planar mirrors. After the expansion the light beam 31 has still a low divergence, i.e. it is almost collimated.

The expanded light beam 31 enters a beam homogenizing unit 34 which homogenizes the light beam 31 and helps to stabilize the angular distribution of the projection light at mask level. To this end the beam homogenizing unit 34 may comprise an optical integrator. Suitable configurations of the beam homogenizing unit 34 are described in WO 2009/080279 A1.

After homogenization the light beam 31 impinges on a beam dividing array 36. The latter divides the light beam 31 into a plurality of individual converging light beams from which only two denoted by LB1, LB2 are shown in FIG. 2. The beam dividing array 36 comprises a plurality of small microlenses 37. Suitable configurations of the beam dividing array 36 are disclosed in PCT/EP2010/005628, for example. Alternatively, the beam dividing array 36 may comprise an array of diffractive optical elements, as it is disclosed in WO 2005/026843 A2 mentioned at the outset, or it may be completely dispensed with.

The converging light beams LB1, LB2 then propagate through a spatial light modulator 38 that is used to produce variable spatial irradiance distributions in a subsequent pupil plane. In this embodiment the spatial light modulator 38 comprises an array 40 of micromirrors 42 that can individually be tilted about two orthogonal axes with the help of actuators (not shown). The spatial light modulator 38, and in particular the actuators for the micromirrors 42, are controlled by a control unit 43 which is connected to an overall system control 45.

Figures 3, 4:
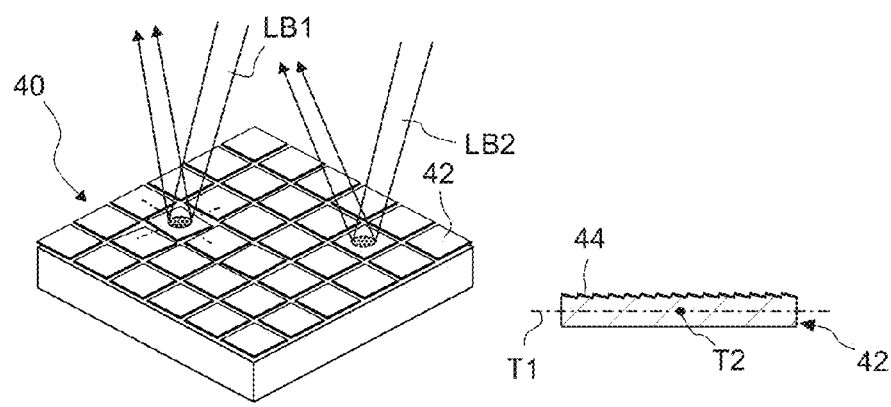
FIG. 3 is a perspective view of a mirror array contained in the illumination system shown in FIG. 2.
FIG. 4 is a cross-section through one of the micromirrors contained in the mirror array shown in FIG. 3.

FIG. 3 is a perspective view of the array 40 illustrating how the converging light beams LB1, LB2 are reflected into different directions depending on the tilting angles of the micromirrors 42 on which the light beams LB1, LB2 impinge. In FIGS. 2 and 3 the array 40 comprises only 66 micromirrors 42; in reality the array 40 may comprise several hundreds or even several thousands micromirrors 42.

As can be seen in the enlarged cross section through one of the micromirrors 42 shown in FIG. 4, each micromirror 42 has a reflective mirror surface comprising diffractive structures 44 that form a blazed reflection phase grating. The structures 44 produce, if illuminated by an at least partially coherent light beam, a periodically varying far field irradiance distribution, as it will be described in further detail below. The orthogonal tilt axes associated with each micromirror 42 are denoted in FIG. 4 by T1 and T2.

Referring again to FIG. 2, the spatial light modulator 38 further comprises a prism 46 having a first planar surface 48a and a second planar surface 48b that are both inclined with respect to an optical axis 47 of the illumination system 12. At these inclined surfaces 48a, 48b the light beams LB1, LB2 are reflected by total internal reflection. The first surface 48a reflects the impinging light beams LB1, LB2 towards the micromirrors 42 of the array 40, and the second surface 48b directs the light beams LB1, LB2 reflected from the micromirrors 42 towards an exit surface 49 of the prism 46.

The directions of the light beams LB1, LB2, and thus the angular irradiance distribution of the light emerging from the exit surface 49 of the prism 46, can thus be varied by individually tilting the micromirrors 42 of the array 40 around the individual tilt axes T1, T2. More details with regard to the spatial light modulator 40 can be gleaned from US 2009/0115990 A1, for example.

The angular irradiance distribution produced by the spatial light modulator 38 is transformed into a spatial irradiance distribution with the help of a first condenser 50 which directs the impinging light beams LB1, LB2 towards an optical integrator 52. In this embodiment the optical integrator 52 comprises a first optical raster plate 54a and a second optical raster plate 54b. A light entrance surface 55 of the first optical raster plate 52a is arranged in a back focal plane of the first condenser 50, and the micromirrors 42 are arranged approximately in its front focal plane so that a Fourier relationship is established between the micromirrors 42 on the one hand and the light entrance surface 55 of the first optical raster plate 54a on the other hand.

Figure 5:
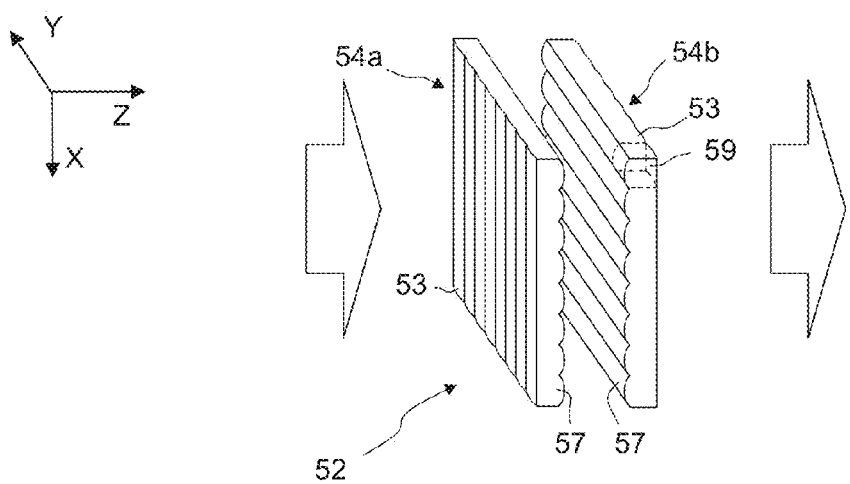
FIG. 5 is a perspective view of an optical integrator is contained in the illumination system shown in FIG. 2.

As can be seen in the perspective view of the optical integrator 52 shown in FIG. 5, each optical raster plate 54a, 54b includes two orthogonal arrays of first and second cylindrical microlenses 53, 57 that are arranged on opposite sides of the optical raster plates 54a, 54b. The second cylindrical microlenses 57 extending along the Y axis are more strongly curved as the first cylindrical microlenses 53 extending along the X direction. A volume that is confined by two intersecting orthogonal cylindrical microlenses 53, 57 defines an optical raster element 59 having a refractive power along the X and the Y direction. However, due to the different curvatures of the first and second cylindrical microlenses 53, 57, the optical raster elements 59 have a stronger refractive power along the X direction than along the Y direction.

Figures 6, 7:
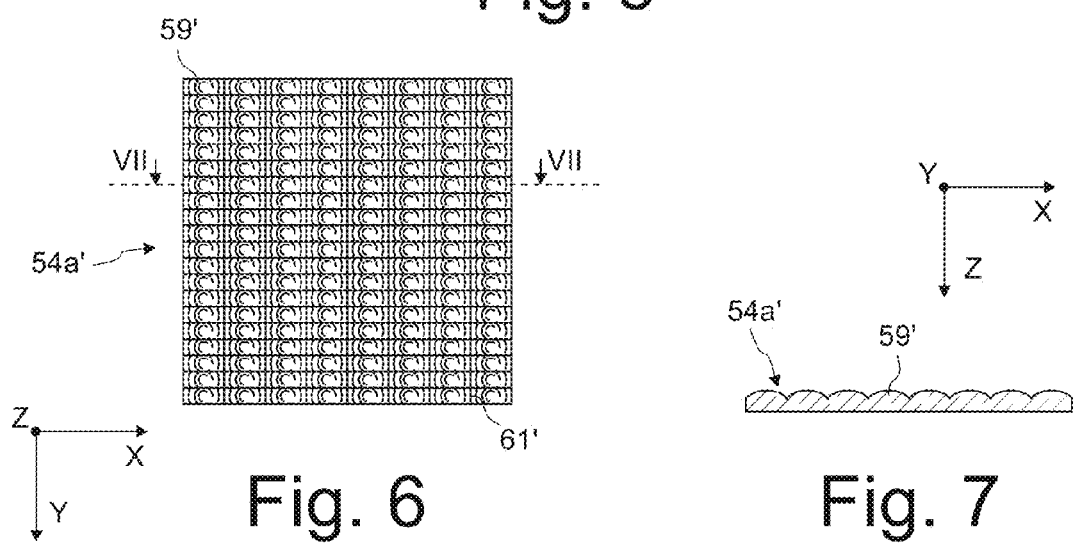
FIG. 6 is a top view on an optical raster plate according to an alternative embodiment comprising a plurality of spherical microlenses each having a rectangular circumference.
FIG. 7 is a sectional view through the optical raster plate shown in FIG. 6 along line VII-VII.

FIGS. 6 and 7 show an optical raster plate 54a' according to an alternative embodiment in a top view and a sectional view along line VII-VII, respectively. In this embodiment the optical raster plate 54a' comprises a regular array of optical raster elements that are formed by spherical microlenses 59' having a rectangular circumference 61'. The aspect ratio of the circumference 61' is identical to the aspect ratio of the field 14 which is illuminated in on the mask 16. Due to the rectangular circumference 61' the microlenses 59' have, similar to the optical raster elements 59 of the optical integrator shown in FIG. 5, a stronger refractive power along the X direction than along the Y direction.

Referring again to FIG. 2, the optical integrator 52 produces a plurality of secondary light sources in a subsequent pupil plane 56 of the illumination system 12. A second condenser 58 establishes a Fourier relationship between the pupil plane 56 and a field stop plane 60 in which an adjustable field stop 62 is arranged. The second condenser 58 thus superimposes the light beams emerging from the secondary light sources in the field stop plane 60 so that the latter is illuminated very homogenously. Further details regarding the optical integrator 52 will be described below in section III.

The field stop plane 60 is imaged by a field stop objective 64 onto a mask plane 66 in which the mask 16 supported on a mask stage (not shown) is arranged. Also the adjustable field stop 62 is thereby imaged on the mask plane 66 and defines the lateral sides of the illuminated field 14 extending along the scan direction Y.

As it will be described in more detail below in section III, the spatial irradiance distribution on the light entrance surface 55 of the first optical raster plate 54a determines the spatial irradiance distribution in the pupil plane 56 and thus the angular irradiance distribution in the field stop plane 60 and the mask plane 66. By carefully setting the tilting angles of the micromirrors 42 of the mirror array 40 with the help of the control unit 43, it is thus possible to quickly produce almost any arbitrary angular irradiance distribution in the mask plane 66. This, in turn, makes it possible to quickly adapt the angular irradiance distribution in the mask plane 66 to the pattern 18 contained in the mask 16. By using an angular irradiance distribution which is specifically tailored to the pattern 18, the latter can be imaged more accurately onto the light sensitive layer 22.

III. Function of Optical Integrator

Figure 8:
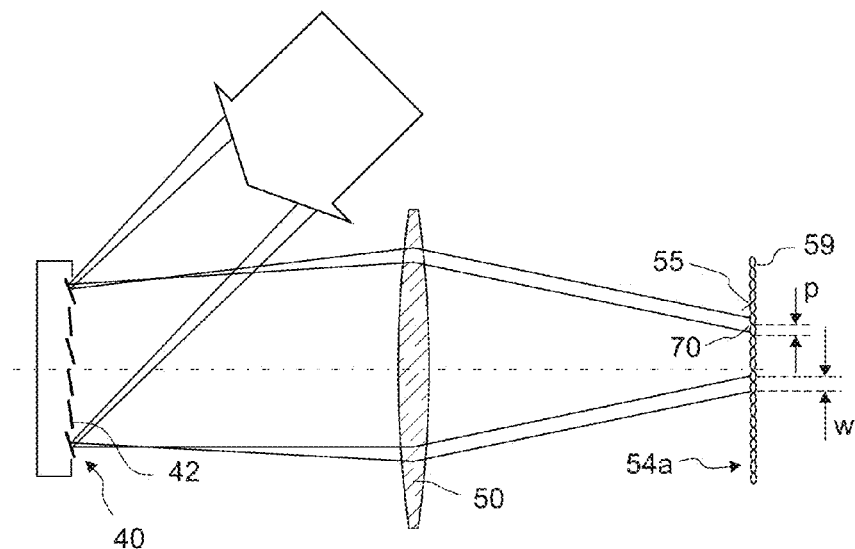
FIG. 8 is a schematic meridional section through the array of micromirrors, the first condenser and the first optical raster plate of the illumination system shown in FIG. 2.

FIG. 8, which is cut-out from FIG. 2, shows the mirror array 40, the first condenser 50 and some of the optical raster elements 59 of the first optical raster plate 54a in a schematic representation. For the sake of simplicity the optical raster elements 59 are illustrated as rotationally symmetrical biconvex lenses.

From each micromirror 42 a light beam emerges which illuminates on the light entrance surface 55 of the first optical raster element 54a a small light spot 70. The position of the light spots 70 can be varied by tilting the micromirrors 42 around the tilt axes T1, T2. The shape of the light spots 70 depends, among others, on the optical properties of the micromirrors 42 of the array 40 and of the beam dividing array 36 arranged in front of the spatial light modulator 38. In this embodiment the geometry of the light spots 70 is circular; in other embodiments the geometry may be or elliptical or approximately rectangular, in particular square. As can be seen in FIG. 8, the width w of the light spots 70 along the X direction is larger than the pitch p of the optical raster elements 59 along this direction. In some embodiments the width w of the light spots 70 is about 2·p or 5·p, but less than 25·p along the X direction.

Each portion of the light entrance surface 55, which is exclusively associated with a single optical raster element 59, is imaged, via the corresponding optical raster element of the second optical raster plate 54b and the second condenser 58, on the intermediate field plane 60.

Figure 9:
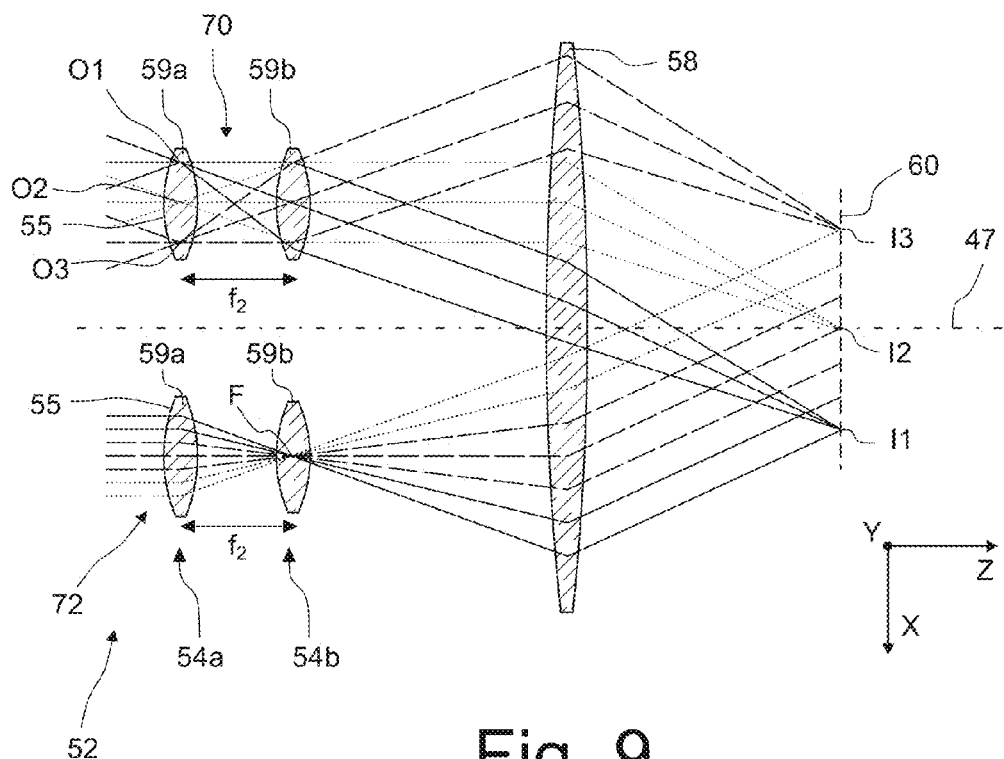
FIG. 9 is a schematic meridional section through two optical channels formed in the optical integrator and a subsequent condenser of the illumination system shown in FIG. 2.

This will now be explained with reference to FIG. 9 which is an enlarged and not to scale cut-out of FIG. 2 showing a portion of the optical integrator 52, the second condenser 58 and the intermediate field plane 60. Those optical raster elements 59a, 59b of the first and second optical raster plates 54a, 54b which are arranged along lines extending parallel to the optical axis 47, form a plurality of optical channels from which only two denoted by 70, 72 are shown in FIG. 9. Each optical channel 70, 72 has the property that projection light is, at least if diffraction is disregarded, confined to the respective channel 70, 72 once it has entered the first optical raster element 59a of this optical channel.

A characterizing feature of optical integrators is generally that the optical raster elements 59a of the first optical raster plate 54a are arranged in the front focal plane of the optical raster elements 59b of the second optical raster plate 54b. This front focal plane is spaced apart from the optical raster elements 59b by their focal length $f_2$. Since the optical raster elements 59b of the second optical raster plate 54b are arranged in the front focal plane of the second condenser 58, the irradiance distribution within each portion of the light entrance surface 55, which is exclusively associated with a single optical channel 70, 72, is imaged on the back focal plane of the second condenser 58, i.e. the intermediate field plane 60. This is illustrated in the upper portion of FIG. 9 for three object points O1, O2, O3 which are imaged by the second optical raster element 59b and the second condenser 58 on image points I1, I2 and I3, respectively. The light entrance surface 55 within each channel 70, 72 is therefore optically conjugate to the intermediate field plane 60 and the mask plane 66.

From FIG. 9 it becomes also clear that each optical channel 70, 72 illuminates the same area confined by the marginal image points I1 and I3 in the intermediate field plane 60. Thus the spatial irradiance distributions on the first optical raster elements 59a, which may differ to some extent, are superimposed in the intermediate field plane 60. This superposition results in a very uniform spatial irradiance distribution in the intermediate field plane 60.

In the lower half of FIG. 9 the conditions are shown if parallel projection light impinges on the optical raster elements 59a of the first optical raster plate 54a. In this embodiment it is assumed that the focal length $f_1$ of the optical raster elements 59a of the first optical raster plate 54a is equal to the focal length $f_2$ so that the focal point F where the parallel light converges is located inside the optical raster elements 59b of the second optical raster plate 54b. Generally, however, the focal lengths $f_1$ and $f_2$ may be different. Again it can be seen that, as a result of the optical conjugation, the region where a light bundle impinges on an optical raster element 59a of the first optical raster plate 54a corresponds to the region which is illuminated by this optical channel in the intermediate field plane 60.

IV. Light Spot Irradiance Distribution a) Prior Art

Figure 10:
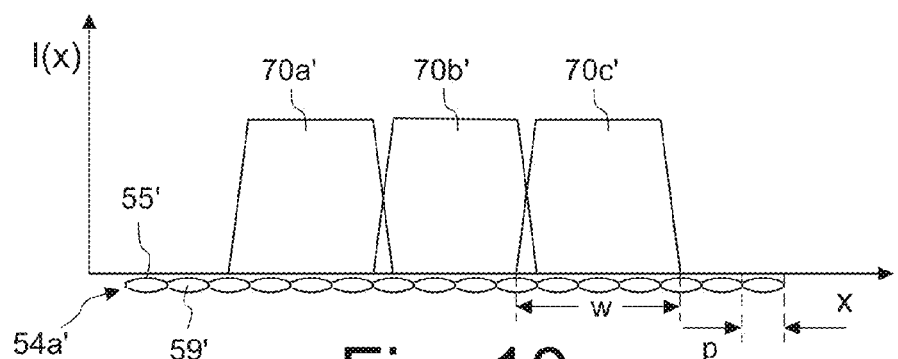
FIG. 10 is a graph showing the irradiance distribution of light spots produced on a first optical raster plate according to the prior art.

FIG. 10 illustrates the irradiance distribution I(x) that is produced by three adjacent light spots 70a', 70b', 70c' on a light entrance surface 55' of a first optical raster plate 54a' contained in a prior art illumination system. In this graph only the variation of the irradiance distribution along the X direction is shown. It is assumed that the irradiance distribution I(y) along the orthogonal Y direction is similar or even identical.

It can be seen that the width w of the light spots 70a', 70b', 70c' exceeds the pitch p of the optical raster elements 59' of the first optical raster plate 54a'. The irradiance distribution within each light spot 70a', 70b', 70c' has a larger central portion, in which the irradiance is uniform, and surrounding portions in which the irradiance linearly drops to zero. If the light spots 70a', 70b', 70c' slightly overlap, a larger illuminated area on the light entrance surface 55' can be produced in which the irradiance is approximately uniform.

Figure 11:
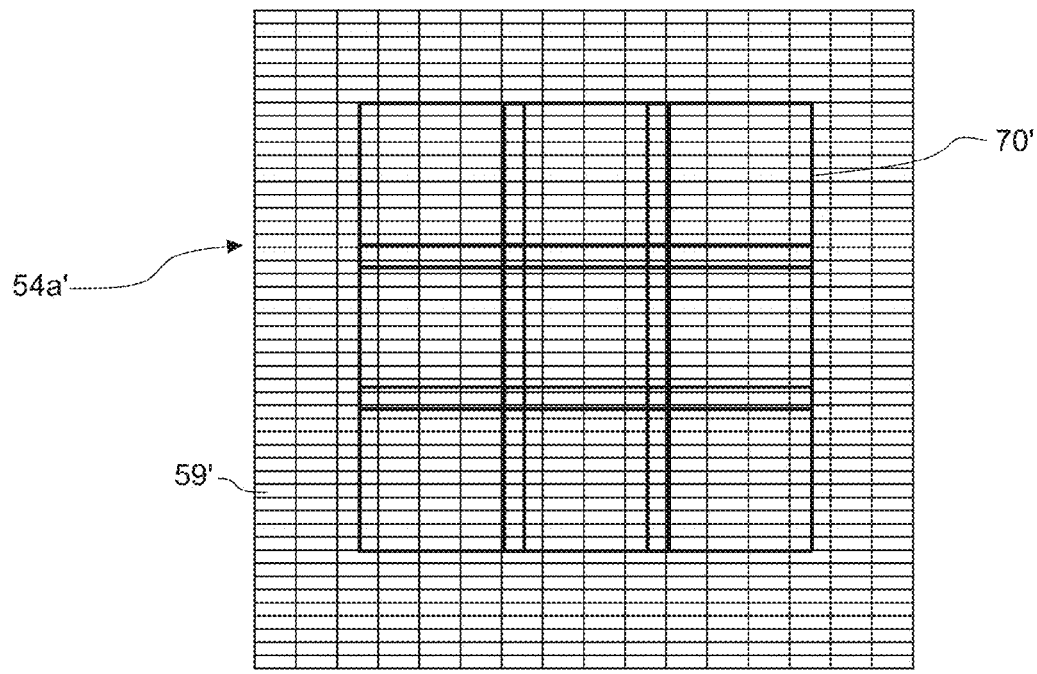
FIG. 11 is a top view on the first optical raster plate shown in FIG. 10 and illuminated by nine light spots according to the prior art.
Figure 12:
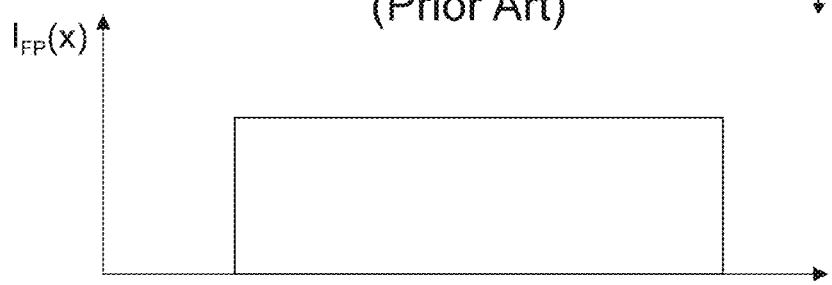
FIG. 12 is a graph showing the irradiance distribution in a field plane according to the prior art.

FIG. 11 is a top view on the prior art optical raster element 54a' showing an arrangement of nine light spots 70' that partially overlap in a manner as shown in FIG. 10. From this illustration it becomes clear that most of the optical raster elements 59' are exposed to a uniform irradiance distribution. Only optical raster elements 59' at the edges of the illuminated region are not uniformly irradiated. Since the number of such optical raster elements 59' being not uniformly irradiated is small in comparison with the number of uniformly irradiated optical raster elements 59', the irradiance distribution obtained in the intermediate field plane 60, and thus in the mask plane 66 which is optically conjugate to the intermediate field plane 60, is mainly determined by the optical raster elements 59' which are uniformly irradiated. Since, as it has been explained in section III, the irradiance distribution in the intermediate field plane 60 is a superposition of the images of the irradiance distributions on the individual optical raster elements 59', a uniform irradiance distribution is obtained in the intermediate field plane 60. This is shown in the graph of FIG. 12 in which the function $I_{FP}(x)$ denotes the irradiance distribution which is produced in the intermediate field plane 60.

b) First Embodiment

Figure 13:
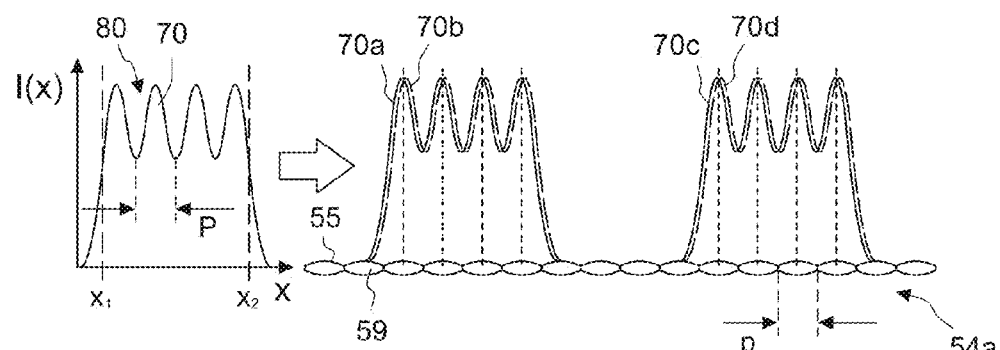
FIG. 13 shows on the left hand side a graph illustrating the irradiance distribution of the light spots produced on the first optical raster plate in accordance with an embodiment of the present invention, and on the right hand side a superposition of a plurality of such light spots on the first optical raster plate in a first relative position to the optical raster elements.

FIG. 13 shows on the left hand side the spatial irradiance distribution I(x) which is associated with a single light spot 70 in accordance with a first embodiment of the present invention. This spatial irradiance distribution comprises a central portion 80 between coordinates $x_1$ and $x_2$ in which the irradiance varies periodically with a spatial period P. In this embodiment the variation is proportional to a $\sin^2(x)$ function, but other periodic functions, for example sawtooth functions, are contemplated as well. Outside the central portion 80 the irradiance I quickly drops to zero.

On the right hand side of FIG. 13 it is illustrated how four identical light spots 70a to 70d having the irradiance irradiate distribution shown on the left hand side illuminate a portion of the light entrance surface 55 of the first optical raster plate 54a. Here it is assumed that the micromirrors 42 of the spatial light modulator 38 are controlled in such a manner that two identical light spots 70a, 70b and 70c, 70d are superimposed one on top of the other. The light spots 70a, 70b and 70c, 70d are illustrated to be slightly displaced along the X direction in FIG. 12 in order to ensure that the superimposed light spots can still be distinguished by the reader.

In this embodiment the spatial period P is identical to the pitch p of the optical raster elements 59. Thus the central portions 80 of superimposed light spots 70a, 70b and 70c, 70d produce identical irradiance distributions on the optical raster elements 59. Here it is further assumed that the light spots 70a to 70d are positioned on the light entrance surface 55 such that the maximum peaks of the irradiance distribution are centered on the optical raster elements 59 with regard to the X direction. Thus the irradiance drops down from a maximum value in the center of each optical raster element 59 to a minimum value at its edges.

Figure 14:
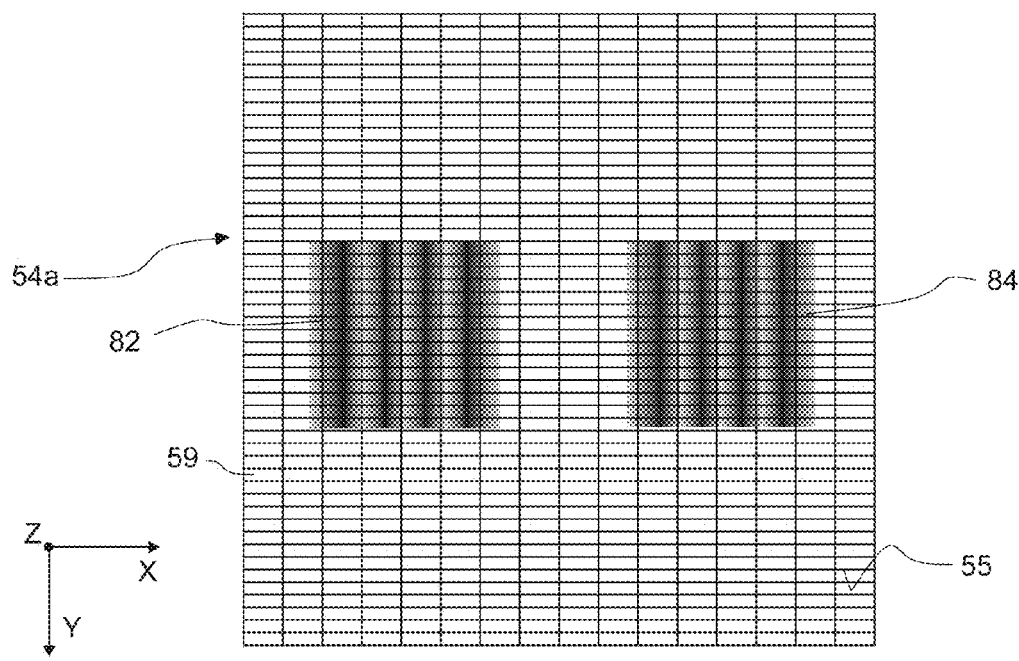
FIG. 14 is a top view on the first optical raster plate illuminated by the four light spots shown in FIG. 13.

FIG. 14 is a top view on the light entrance surface 55 of the first optical raster element 54a on which the four light spots 70a to 70d are produced. The combined irradiance distributions 82, 84 which are obtained by superimposing the light spots 70a, 70b on the one hand and 70c, 70d on the other hand are identical, but are located at different positions on the light entrance surface 55. In this representation dark areas correspond to high irradiances and bright areas to lower irradiances.

Figure 15:
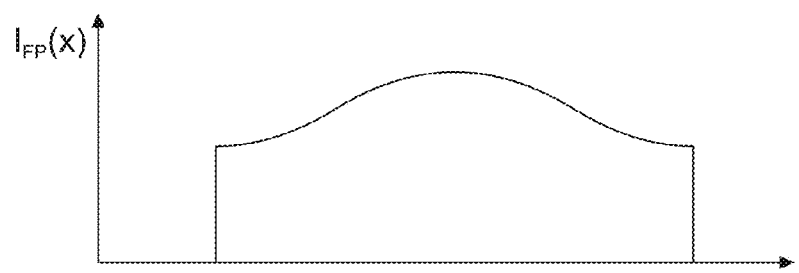
FIG. 15 is a graph showing the irradiance distribution in a field plane for the configuration shown in FIGS. 13 and 14.

Since each optical raster element 59 is irradiated with the same irradiance distribution having a maximum value in the center and minimum values at the edges, the superposition of the images of all these irradiance distributions in the intermediate field plane 60 has the same spatial variation, i.e. in the middle of the illuminated field the irradiance has its maximum value, and this maximum value continuously drops to a minimum value at the edges of the field along the X direction. This resulting irradiance distribution $I_{FP}(x)$ in the intermediate field plane 60 is shown in FIG. 15. Also in this graph the contributions from optical raster elements 59 which are not illuminated by light inside the central portions 80 of the light spots 70a to 70d are neglected.

Producing light spots that have along a reference direction a spatial irradiance distribution comprising a portion in which the irradiance varies periodically thus makes it possible to produce a non-uniform irradiance distribution in the intermediate field plane 60, and thus also in the mask plane 66, without any light losses. An irradiance distribution $I_{FP}(x)$ as shown in FIG. 15 may be particularly useful if it is obtained along the orthogonal Y direction which is parallel to the scan direction of the apparatus 10. Along this direction it is often desired to produce an irradiance distribution having a maximum value in the center of the field with respect to the Y direction.

Figure 16:
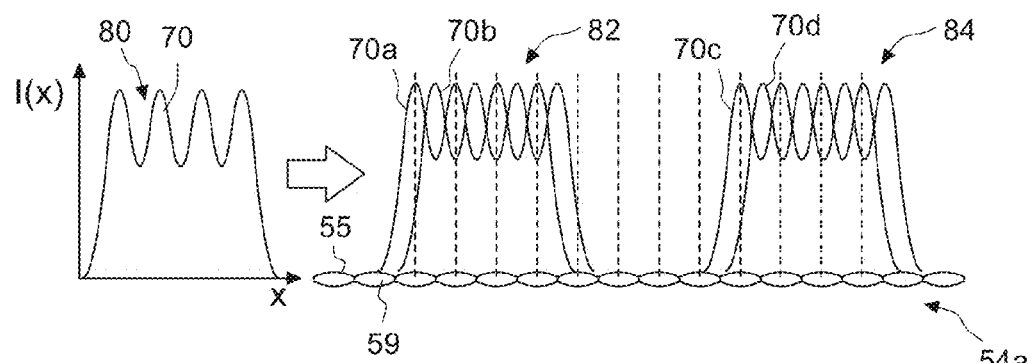
FIG. 16 shows on the right hand side a superposition of a plurality of light spots on the first optical raster plate in a second relative position to the optical raster elements.
Figure 17:
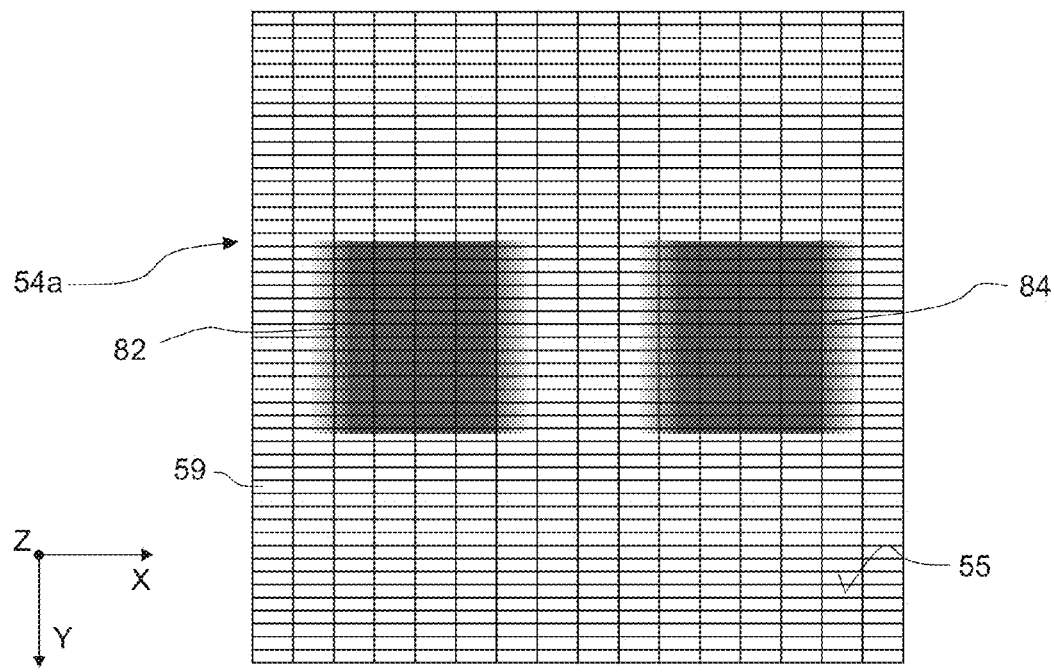
FIG. 17 is a top view on the first optical raster plate illuminated by the four light spots shown in FIG. 16.
Figure 18:
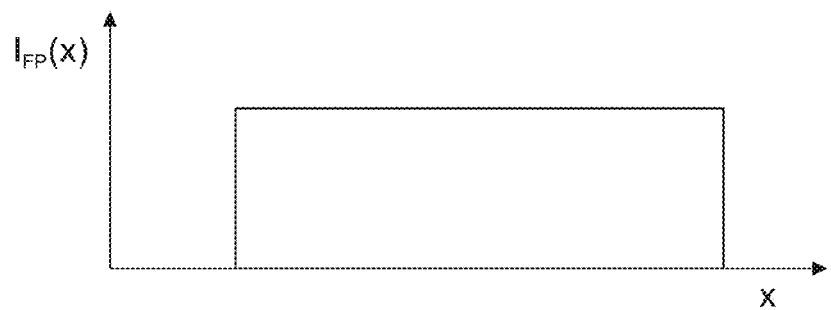
FIG. 18 is a graph showing the irradiance distribution in a field plane for the configuration shown in FIGS. 16 and 17.

FIGS. 16 to 18 correspond to FIGS. 13 to 15, but in this spot configuration it is assumed that the light spots 70a, 70b on the one hand and 70c, 70d on the other hand are not superimposed such that they completely overlap, but are displaced relative to each other by P/2. In each of the combined irradiance distributions 82, 84 there will then be a portion where the central portions 80 of the individual light spot 70a, 70b and 70c, 70d overlap so that the resulting irradiance distribution is proportional to $\sin^2(x)+\cos^2(x)=1$. This slightly displaced arrangement of the light spots 70a to 70d can therefore be used to uniformly illuminate the optical raster elements 59, as it is shown in FIG. 17. This results in the intermediate field plane 60 in an irradiance distribution $I_{FP}(x)$ which has the same rectangular shape as it has been described above with reference to FIG. 12 for the prior art approach.

Since the micromirrors 42 can be tilted also during a single scan cycle, it is possible to vary the irradiance distribution in the intermediate field plane 60, for example between the irradiance distributions shown in FIGS. 15 and 18, for exposure dose control purposes along the X direction. If this approach is applied to the Y direction, it is possible, for example, to modify the irradiance distribution within the illuminated field 14 at the beginning and the end of each scan cycle. It may even be considered to dispense with the mechanically complicated field stop 62 that is arranged in the field stop plane 60 as Y shutter and exposure dose controller.

c) Field Dependent Illumination Setting

In the configurations explained above with reference to FIGS. 13 to 18 the positions of the light spots 70a to 70d had been determined such that each optical raster element 59 is irradiated identically, if one disregards partially irradiated optical raster elements at the edges of the light spots. Since each optical raster element 59 corresponds to a specific small range of angles under which projection light impinges on the intermediate field plane 60, this implies that the annular light distribution in the intermediate field plane 60 is identical at all field positions.

However, it is also possible to produce at different locations on the light entrance surface 55 light spots that have different relative positions to the optical raster elements 59. This will be explained in the following with reference to FIGS. 19 to 21 which correspond to FIGS. 16 to 18 with the exception that the relative positions of the light spots to the optical raster elements 59 are modified.

Figure 19:
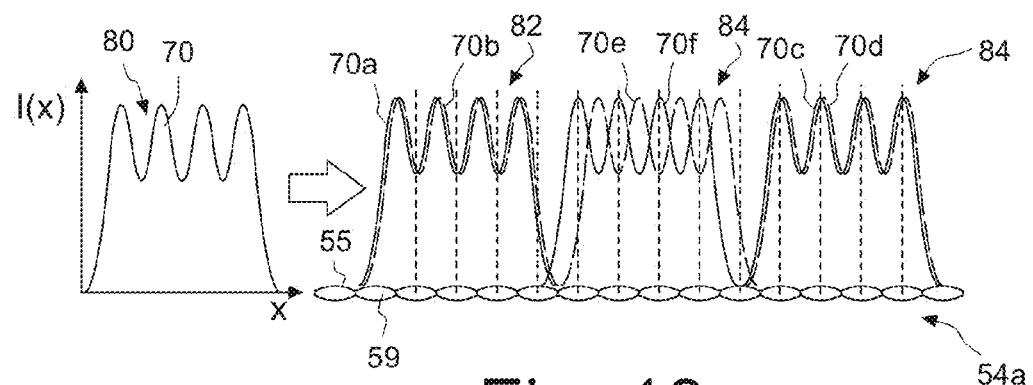
FIG. 19 shows on the right hand side a superposition of a plurality of light spots on the first optical raster plate in a third relative position to the optical raster elements.
Figure 20:
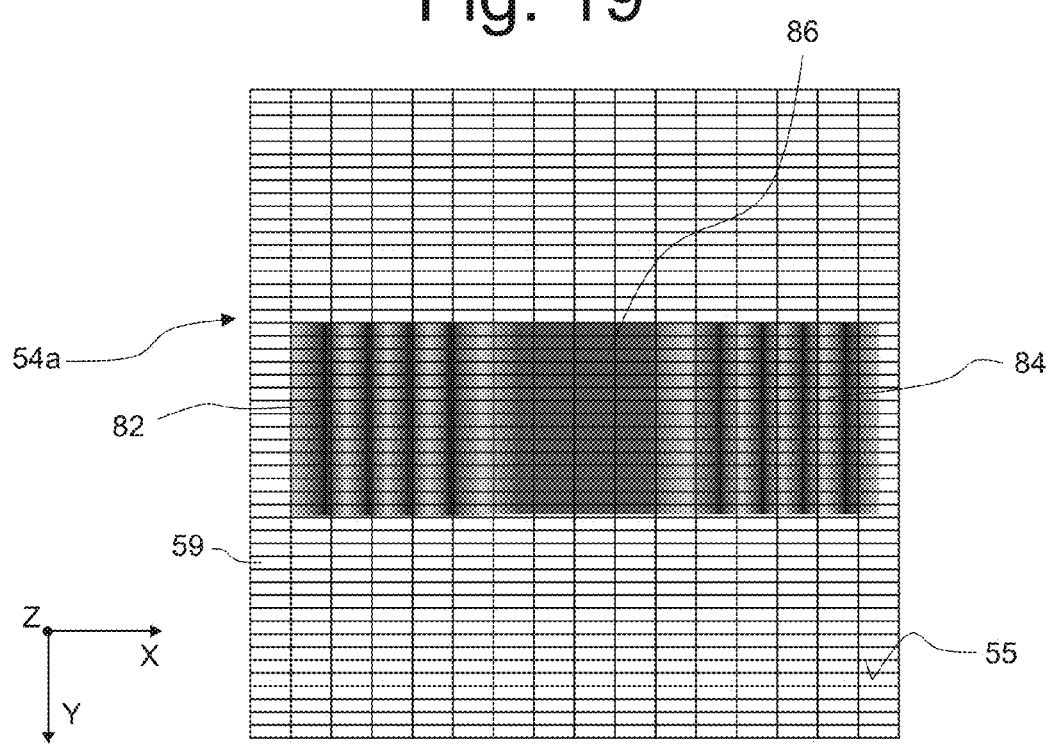
FIG. 20 is a top view on the first optical raster plate illuminated by the six light spots shown in FIG. 19.

In FIGS. 19 and 20 it can be seen that six light spots 70a to 70f are used to irradiate three different locations on the light entrance surface 55. The irradiance distribution of each light spot 70a to 70f is assumed to be the same as in the configurations shown in FIGS. 16 to 18.

On the left hand side of the light entrance surface 55 shown in FIGS. 19 and 20 two light spots 70a, 70b are superimposed to a combined irradiance distribution 82 so that they completely overlap and that the minimum values of the periodic irradiance distributions are centered on the optical raster elements 59.

On the right hand side of the light entrance surface 55 two light spots 70c, 70d are also superimposed to a combined irradiance distribution 84 so that they completely overlap, but the relative positions of the light spots 70c, 70d to the optical raster elements 59 are different. More specifically, not the minimum but the maximum values of the irradiance distributions are now centered on the optical raster elements 59, as it is also shown in FIG. 13.

At a location at the center of the light entrance surface 55 two light spots 70e, 70f are superimposed to a combined irradiance distribution 86 so that they partially overlap and are displaced along the X direction by P/2. Thus the combined irradiance distribution 86 comprises a portion in which the irradiance is uniform.

Figure 21:
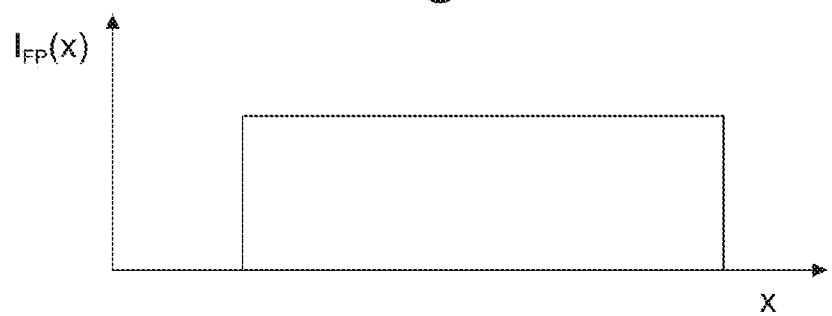
FIG. 21 is a graph showing the irradiance distribution in a field plane for the configuration shown in FIGS. 19 and 20.

The contribution of the combined irradiance distribution 86, which is obtained by superimposing the light spots 70e, 70f, to the total irradiance distribution in the intermediate field plane 60 is again uniform, as it has been shown in FIG. 18. The contribution of the combined irradiance distribution 84, which is obtained by superimposing the light spots 70c, 70d, to the total irradiance distribution in the intermediate field plane 60 is identical to the distribution as shown in FIG. 15. The contribution of the combined irradiance distribution 82, which is obtained by superimposing the light spots 70a, 70b, to the total irradiance distribution in the intermediate field plane 60 is similar to the distribution shown in FIG. 15, but with the minimum irradiance in the center and the maximum irradiance at the minimum and maximum field positions along the X direction. The superposition of all contributions therefore results in a total irradiance distribution which is again uniform, as it is shown in FIG. 21.

However, it should be noted that now different optical raster elements 59 are irradiated differently. Keeping in mind that each optical raster element 59 is associated with a specific small range of angles of incidence, it becomes clear that with these positions of the light spots 70a to 70f the angular light distribution in the intermediate field plane 60 is not independent of the field position anymore.

Figure 22:
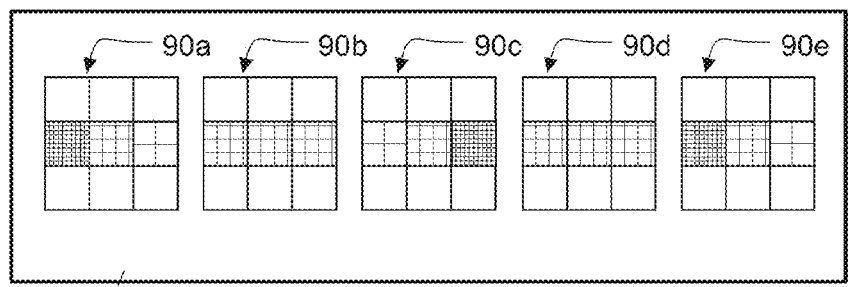
FIG. 22 is a schematic illustration showing the angular irradiance distribution at different field positions in the mask plane for the third spatial relationship shown in FIGS. 19 and 20.

FIG. 22 schematically illustrates the illuminated field 14 on the mask 16. The five 3×3 grids 90a to 90e shall indicate from which direction light impinges on a point at the respective field position. Each of the nine fields that form the respective grids 90a to 90e represents a direction from which light impinges on the respective field point. The darker a particular field is, the more light impinges on the respective field point from the direction which is associated with this field.

As it can be seen in FIG. 20, only a central stripe formed by the combined irradiance distributions 82, 84 and 86 and extending along the X direction is illuminated on the light entrance surface 55 of the first optical raster plate 54a. Since locations on the light entrance surface 55 are associated with directions in the subsequent intermediate field plane 60, the angular range of projection light along the X direction is larger than the angular range of projection light along the Y direction.

However, not all points in the intermediate field plane 60 are illuminated from the same angles. Referring again to FIG. 22, if we start with the grid 90a which is associated with a field point close to the left edge of the field 14 in FIG. 22, the angular contribution is greatest for those optical raster elements 59 in FIG. 19 in which also their X edges extending parallel to the Y direction are illuminated with maximum irradiance. These are those optical raster elements 59 which are illuminated by the combined irradiance distribution 82 which is a superposition of the light spots 70a and 70b. As can be seen best in FIG. 19, the maximum irradiance occurs at the edges of the optical raster elements 59. Since the combined irradiance distribution 82 is arranged on the left hand side in FIG. 19, light impinges on the left field point that is associated with the grid 90a primarily from the angles which are associated with the position of the combined irradiance distribution 82. Here it is assumed, for the sake of simplicity, that the directions are not reversed by the intermediate optics so that the left side in FIG. 20 corresponds to the left side within the grid 90a in FIG. 22.

The central field in the grid 90a represents normal or almost normal directions of incidence. These directions are associated with the combined irradiance distribution 86 which is located on the optical axis 47 at the center of the light entrance surface 55. As can be seen best in FIG. 19, the light spots 60e, 60f combine in such a manner that a uniform irradiance distribution is obtained. This implies that all points in the field 14 receive the same amount of projection light having a normal or almost normal direction of incidence. For that reason the central fields in the grids 90a to 90e in FIG. 22 all have the same darkness. This darkness represents a medium irradiance which is smaller than the maximum irradiance that is obtained by superimposing two light spots 70a, 70b or 70c, 70d one on top of the other so that they completely overlap.

The combined irradiance distribution 84 on the right hand side of FIG. 20 is produced by the light spots 70c, 70d having a maximum irradiance at the centers of the optical raster elements 59. Conversely, the contributions from the directions associated with the locations of the combined irradiance distribution 84 are smallest for field points at the X edges of the field 14. Hence field points at the lateral edges of the field 14 and represented by the grids 90a and 90e receive only a small amount of light from this direction. For that reason the right fields in the grids 90a and 90e are the brightest.

With similar considerations also the different shadings in the fields of the other grids 90b to 90e can be explained.

It is noted that the total amount of light received by each field point associated with the grids 90a to 90e is equal in compliance with the graph shown in FIG. 21. This becomes clear by comparing the different darknesses in the grids 90a to 90e under the assumption that the three irradiances represented by the three darknesses differ by the same amount.

Figure 23:
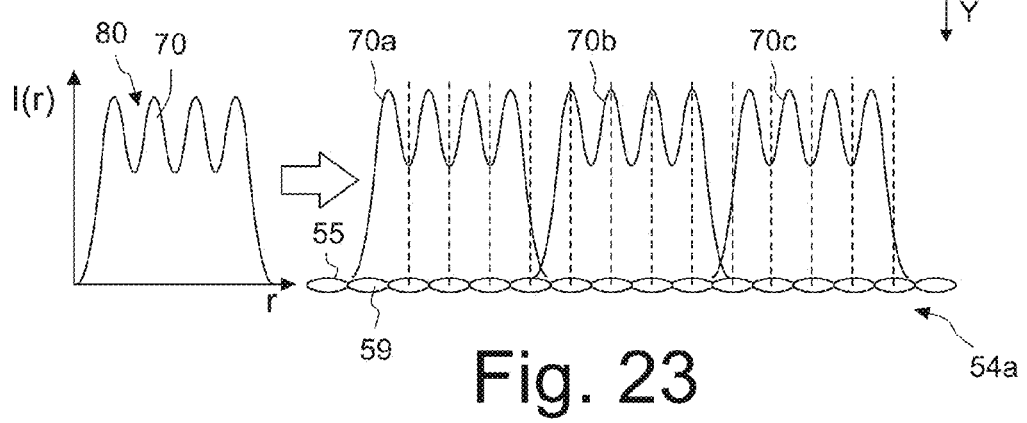
FIG. 23 shows on the right hand side a superposition of a plurality of light spots on the first optical raster plate in a fourth relative position to the optical raster elements.

A field dependent angular irradiance distribution in the intermediate field plane 60 and the subsequent mask plane 66 is often useful for imaging masks 16 where the orientation and dimensions of the structures vary along the X direction. It is then possible, for example, to produce a conventional illumination setting in the center of the field 14 and an X dipole setting at the lateral sides of the field 14. FIG. 23 illustrates a relative position of light spots 70a to 70c to the optical raster elements 59 that produces such field dependent illumination settings. In this embodiment the light spots 70a, 70b, 70c do not significantly overlap.

Figure 24:
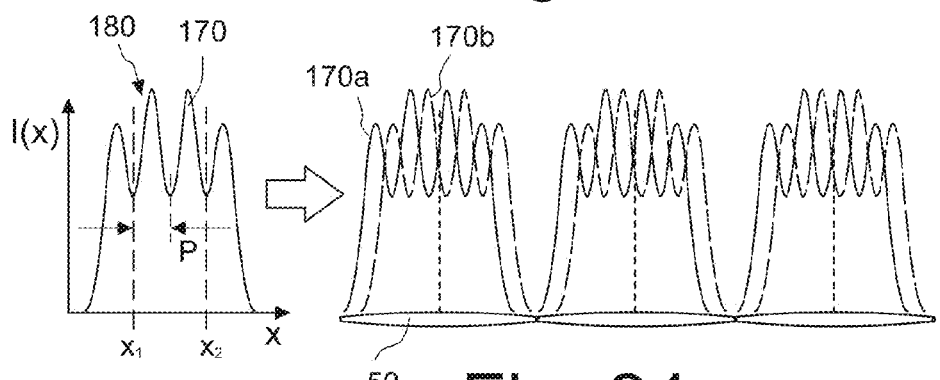
FIG. 24 shows on the left hand side a graph illustrating the irradiance distribution of the light spots produced on the first optical raster plate in accordance with another embodiment of the present invention, and on the right hand side a superposition of a plurality of such light spots on the first optical raster plate in a fifth relative position to the optical raster elements.
Figure 25:
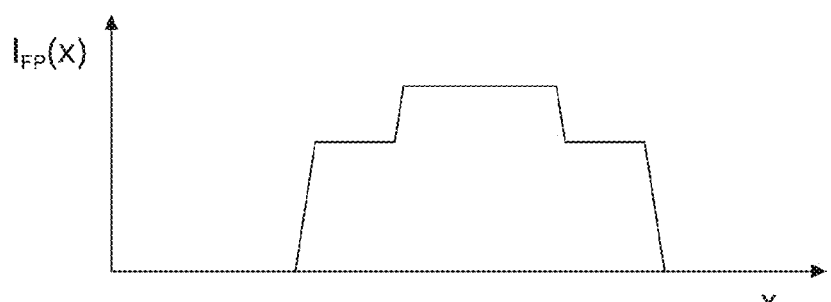
FIG. 25 is a graph showing the irradiance distribution in a field plane for the configuration shown in FIG. 24.

So far it has been assumed that the light spots have an irradiance distribution only along the X direction as it is shown on the left hand side of FIG. 13 and that the light spots 70 extend over more than one optical raster element 59. However, the light spots may also have portions with other periodic irradiance distributions. Furthermore, the width w of the light spots may be equal to or smaller than the pitch p of the optical raster elements 59. FIG. 24 exemplarily shows on the left hand side a spatial irradiance distribution of a light spot 170 having a width w=p. This irradiance distribution oscillates along the x coordinate, too, but only a smaller central portion 180 between the coordinates $x_1$ and $x_2$ is periodic. If two such light spots 170 are displaced by P/2, the combined irradiance distribution $I_{FP}(x)$ produced on each optical raster element 59 has approximately a shape as it is shown in FIG. 25 for the superimposed irradiance distribution in the intermediate field plane 60.

d) Alternative Embodiments

In the embodiments described above with reference to FIGS. 1 to 25 the micromirrors 42 are capable of being tilted around the orthogonal tilt axes T1, T2. It may also be envisaged to add as additional degree of freedom a rotation about a rotational axis that runs perpendicular to the tilt axes T1, T2.

Figure 26:
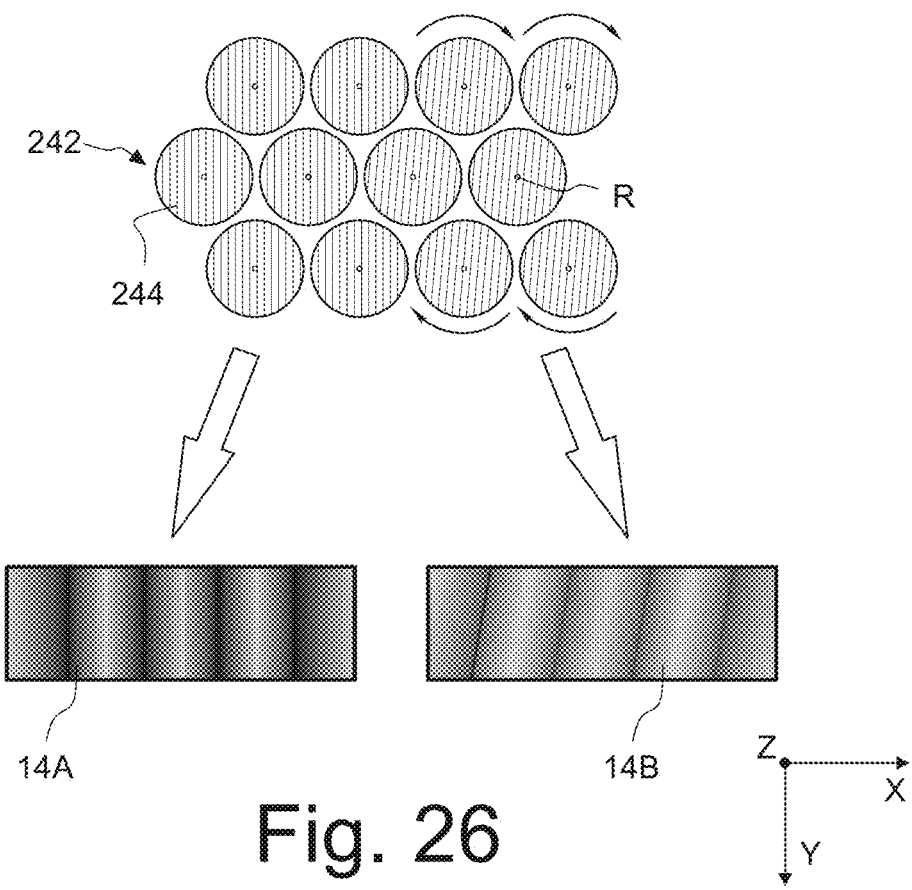
FIG. 26 shows in its top portion a plurality of micromirrors that can be tilted and also rotated around a rotational axis, and in a lower portion the irradiance distributions in a field plane for different rotational angles.

FIG. 26 shows in its top portion a plurality of micromirrors 242 that have a circular circumference. The micromirrors 242 are also provided with diffractive structures 244, but can be individually rotated around a rotational axis R. The diffractive structures 244 on top of the micromirrors 242 will then be rotated, too, and consequently also light spots produced on the light entrance surface 55 of the first optical raster plate 54a will rotate accordingly.

In the lower portion of FIG. 26 it is illustrated how the irradiance distribution in field planes depends on the angle of rotation about the rotational axis R. With rotational angles of 0° and 180° the irradiance distribution varies only along the X direction (see field 14A), but with all other rotational angles the irradiance will vary along the X and also along the Y direction (see field 14B).

Figure 27:
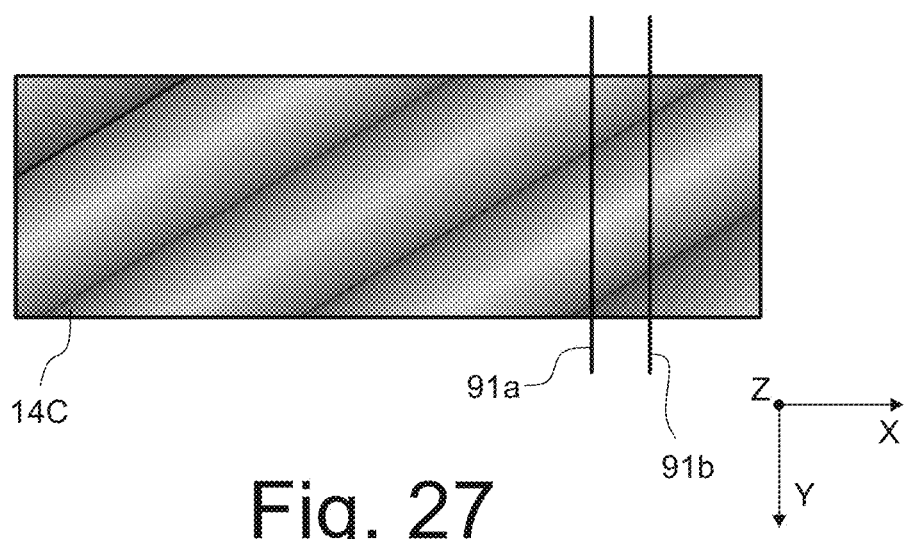
FIG. 27 shows the irradiance distribution in a field plane for a specific rotational angle so that the scan integrated exposure dose is field-independent.

With certain rotational angles it is also possible to produce an irradiance distribution in field planes that varies along the X and the Y direction, but nevertheless results in a uniform exposure dose during a complete scan cycle. This is illustrated in FIG. 27 showing a field 14C and two arbitrary lines 91a, 91b extending along the Y direction. If one integrates the irradiances along each line 91a, 91b, the two integrals will be identical.

If one departs from this particular angle, it is possible to carefully vary the exposure dose. Thus the rotations of the micromirrors 42 around the rotational axis R may be used to finely adjust the exposure dose.

V. Producing Periodic Light Spot Irradiance Distributions

In the first embodiment it has been assumed that the periodically varying irradiance distributions within portions 80 of the light spots 70 are produced by diffractive structures 44 forming a blazed reflection phase grating on the micromirrors 42.

FIG. 28 is a cross-section through a micromirror 342 according to another embodiment. Here the micromirror 342 is provided with a reflective coating 344 which has a spatially varying reflectance.

FIG. 29 is a cross-section through a micromirror 442 according to a still further embodiment. Here the micromirror 442 has a corrugated reflective surface 444. The corrugations produce an additional angle variation, and this angle variation translates in the Fourier related light entrance surface 55 of the first optical raster element 54a in a periodically varying spatial irradiance distribution.

FIG. 30 shows a portion of an illumination system 512 according to an embodiment in which the spatially varying irradiance distribution of the light spots 70 is not produced by the micromirrors 42, but by a diffractive optical element 92 which is arranged between the spatial light modulator 38 and the first condenser 50. The diffractive optical element 92 introduces the additional angular light distribution which is transformed, by the Fourier relationship established by the first condenser 50, into the desired spatially varying irradiance distribution of the light spots on the light entrance surface 55 of the first optical raster plate 54a.

Figure 31:
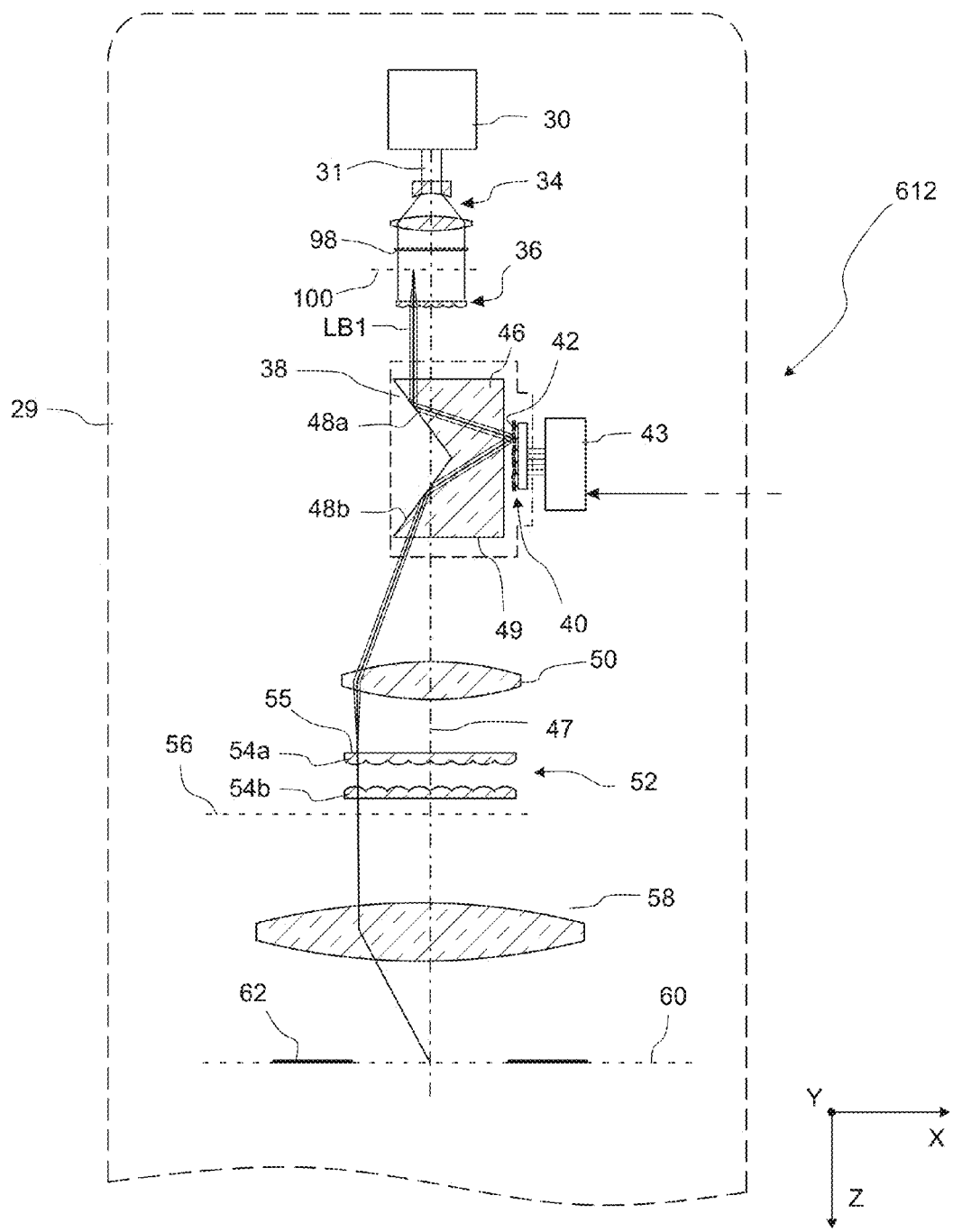
FIG. 31 is a meridional section through a portion of an illumination system according to still another embodiment in which a spatially varying irradiance distribution in a Talbot plane is imaged on the first optical raster element.

FIG. 31 shows a portion of an illumination system 612 according to a still further embodiment in which a periodically varying spatial irradiance distribution is imaged, via the spatial light modulator 38, on the light entrance surface 55 of the first optical raster element 54a. The periodically varying irradiance distribution is produced with the help of a further optical raster plate 98 which is arranged between the beam expansion unit 32 and the beam dividing array 36.

The further optical raster plate 98 comprises a plurality of optical raster elements, for example spherical or cylindrical micro-lenses, that produce, if illuminated by coherent light, at certain distances and in planes orthogonal to the optical axis 47 strongly varying irradiance distributions formed by interference patterns. This near-field diffraction effect is often referred to as Talbot effect, and the planes, in which self-images of the further optical raster plate 98 can be observed, are referred to as Talbot planes.

Figure 32:
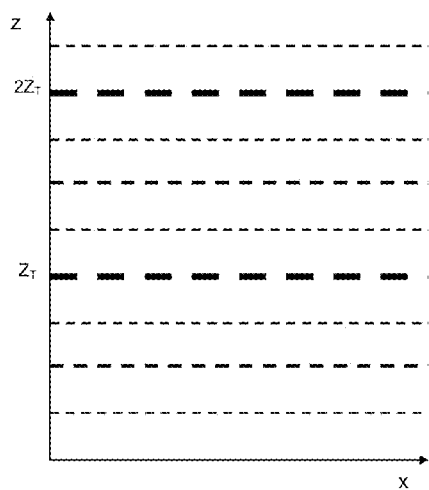
FIG. 32 is a graph illustrating irradiance distributions produced by near-field diffraction in different Talbot planes behind a diffraction grating or a similar periodically varying element.

FIG. 32 is a graph illustrating the Talbot effect at different distances z from the further optical raster plate 98. The thick dashed lines indicate the Talbot planes, and the thinner dashed lines indicated intermediate planes in which self-images of a higher spatial frequency are observed. The Talbot planes are spaced apart from the further optical raster plate 98 by a Talbot length $z_T=2 \cdot b^2/\lambda$, where b is the pitch of the optical raster element and $\lambda$ is the wavelength of the incident light.

Referring again to FIG. 31, the interference pattern 100 in one of the Talbot planes is imaged via the lenses of the beam dividing array 36, the micromirrors 42 and the first condenser 50 on the light entrance surface 55 of the first optical raster plate 54a. If necessary the surfaces of the micromirrors 42 may be curved so as to add additional reflective power.

VI. Important Method Steps

Figure 33:
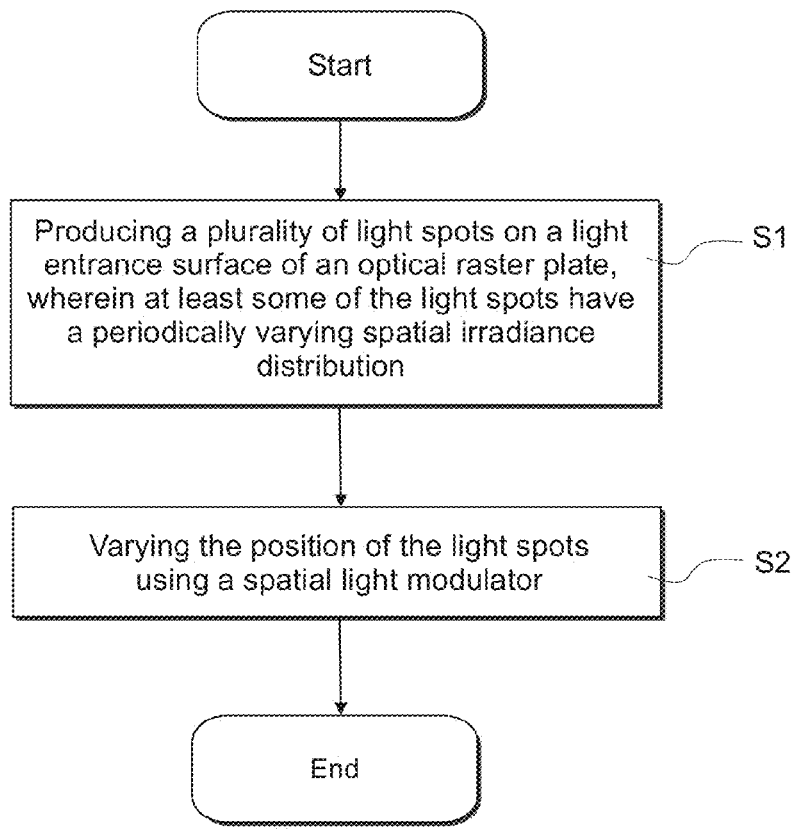
FIG. 33 is a flow diagram illustrating important method steps of the present invention.

FIG. 33 is a flow diagram which illustrates important steps of a method of illuminating a mask in a microlithographic projection exposure apparatus in accordance with the present invention.

In a first step S1 a plurality of light spots are produced on a light entrance surface of an optical raster plate. At least some of the light spots comprise a portion in which the irradiance varies periodically.

In a second step S2 the positions of the light spots are varied using a spatial light modulator.

The invention claimed is:

1. An illumination system, comprising:
an optical raster plate having a light entrance surface configured so that, during use of the illumination system, an irradiance distribution on the light entrance surface determines an angular light distribution of projection light that impinges on a mask to be illuminated by the illumination system;
a control unit; and
a spatial light modulator configured so that, during use of the illumination system, the spatial light modulator produces a plurality of light spots on the light entrance surface of the optical raster plate,
wherein:
the spatial light modulator is configured so that, during use of the illumination system, the spatial light modulator varies the position of the light spots on the light entrance surface in response to a signal received from the control unit;
at least some of the light spots have, along a direction, a spatial irradiance distribution comprising a portion in which the irradiance varies periodically with a spatial period; and
the illumination system is a of a microlithographic illumination system.

2. The illumination system of claim 1, wherein the control system is configured so that, during use of the illumination system, the control system controls the spatial light modulator so that two of the light spots at least partly overlap on the light entrance side of the optical raster plate.

3. The illumination system of claim 2, wherein the two overlapping spots are displaced relative to each other along the reference direction by n1·P/2, with P being the spatial period, and n1=±1, ±3, ±5, . . . .

4. The illumination system of claim 2, wherein the two overlapping spots are displaced relative to each other along the reference direction by n2·P, with P being the spatial period, and n2=0, ±1, ±2, ±3, . . . .

5. The illumination system of claim 1, wherein the optical raster plate comprises a plurality of optical raster elements arranged along the reference direction with a pitch.

6. The illumination system of claim 5, wherein the pitch is an integral multiple of the spatial period P so that p=m·P, with P being the spatial period, p being the pitch, and m being a positive integer.

7. The illumination system of claim 5, wherein the light spots have a maximum width w along the reference direction with w>p.

8. The illumination system of any claim 1, wherein:
the spatial light modulator comprises an array of beam deflecting elements;
each beam deflecting element is individually capable of deflecting impinging light in a direction which depends on the signal received from the control unit; and
during use of the illumination system, each light spot is associated with exactly one beam deflecting element.

9. The illumination system of claim 1, wherein:
the control system is configured so that, during use of the illumination system, the control system controls the spatial light modulator so that a first light spot is produced at a first location on the light entrance surface of the optical raster plate and so that a second light spot is produced at a second location on the light entrance surface of the optical raster plate;
maximums of the irradiance distribution of the first light spot occur in first relative positions to the optical raster elements;
maximums of the irradiance distribution of the second light spot occur in second relative positions to the optical raster elements;
the first and the second locations are different; and
the first and second relative positions are different.

10. The illumination system of claim 1, wherein the spatial light modulator is configured so that, during use of the illumination system, the spatial light modulator rotates the light spots that are produced on the light entrance surface of the optical raster plate in response to a further command signal received from the control unit.

11. The illumination system of claim 1, wherein:
the control system is configured so that, during sue of the illumination system, the control system controls the spatial light modulator so that a first light spot is produced at a first location on the light entrance surface of the optical raster plate and so that a second light spot is produced at a second location on the light entrance surface of the optical raster plate;
maximums of the irradiance distribution of the first light spot occur in first relative positions to the optical raster elements;
maximums of the irradiance distribution of the second light spot occur in second relative positions to the optical raster elements;
the first and the second locations are different;
the first and second relative positions are different;
the spatial light modulator is configured so that, during use of the illumination system, the spatial light modulator rotates the light spots that are produced on the light entrance surface of the optical raster plate in response to a further command signal received from the control unit;
the beam deflecting elements are tiltable around two tilt axes;
the beam deflecting elements are rotatable around a rotational axis;
the tilt axes and the rotational axis are not parallel to each other.

12. The illumination system of claim 1, wherein the periodically varying irradiance is produced by structures upstream of the optical raster plate along a path of the light through the illumination system, and the structures are selected from the group consisting of diffractive structures, periodic refractive structures and periodic reflective structures.

13. The illumination system of claim 12, wherein:
the spatial light modulator comprises an array of beam deflecting elements;
each beam deflecting element is individually capable of deflecting impinging light in a direction which depends on the signal received from the control unit;
each light spot is associated with exactly one beam deflecting element; and
the diffractive structures are supported by the beam deflection elements, and/or the beam deflection elements have a corrugated reflective or a corrugated refractive surface.

14. The illumination system of claim 1, wherein the periodically varying irradiance is produced by diffractive structures upstream of the optical raster plate along a path of the light through the illumination system, and the diffractive structures are supported by a plate that is upstream of the optical raster plate along the path of the light through the illumination system.

15. The illumination system of claim 1, wherein the illumination system is configured so that the periodically varying irradiance is produced during use of the illumination system by imaging, via the optical modulator, a primary periodically varying irradiance distribution on the light entrance surface of the optical raster plate.

16. The illumination system of claim 15, wherein the primary periodically varying irradiance distribution is an interference pattern.

17. The illumination system of claim 15, wherein primary periodically varying irradiance distribution is an interference pattern that is a self image of a diffraction grating.

18. A method of using an illumination system to illuminate a mask, the method comprising:
changing an angular light distribution of light impinging on the mask by varying a position of light spots on an entrance surface of an optical raster plate of the illumination system, at least some of the light spots having, along a direction, a spatial irradiance distribution comprising a portion in which the irradiance varies periodically with a spatial period.

19. The method of claim 18, wherein the optical raster plate comprises a plurality of optical raster elements that are arranged along the direction with a pitch.

20. The method claim 18, wherein:
the light spots are produced on the light entrance surface of the optical raster plate;
the light spots are rotated;
the optical light modulator comprises mirrors that are tilted around two tilt axes and rotated around a rotational axis; and
the tilt axes and the rotational axis are orthogonal to each other.

* * * * *

UNITED STATES PATENT AND TRADEMARK OFFICE
CERTIFICATE OF CORRECTION

PATENT NO.         : 8,699,121 B2                                          Page 1 of 1
APPLICATION NO.    : 14/044048
DATED              : April 15, 2014
INVENTOR(S)        : Markus Deguenther It is certified that error appears in the above-identified patent and that said Letters Patent is hereby corrected as shown below:

In the Specification:

In Col. 4, lines 40-54, delete "This condition ensures that,... irradiance distribution." and insert the same on Col. 4, line 39, after "integer." as the continuation of the Paragraph.

In Col. 5, line 33, delete "resuit" and insert -- result --.

In Col. 7, line 8, delete "threedimensional" and insert -- three-dimensional --.

In Col. 19, line 1, delete "Fourierrelated" and insert -- Fourier-related --.

In the Claims:

In Col. 20, line 15, in Claim 1, delete "a of a" and insert -- a --.

In Col. 20, line 40, in Claim 8, delete "of any" and insert -- of --.

In Col. 22, line 35, in Claim 20, delete "method" and insert -- method of --.

Signed and Sealed this
Fifteenth Day of July, 2014

Michelle K. Lee
*Deputy Director of the United States Patent and Trademark Office*